United States Patent
Nagashima

(10) Patent No.: US 10,403,527 B2
(45) Date of Patent: Sep. 3, 2019

(54) PACKING STRUCTURE FOR PACKING SUBSTRATE STORING CONTAINER

(71) Applicant: MIRAIAL CO., LTD., Tokyo (JP)

(72) Inventor: Tsuyoshi Nagashima, Tokyo (JP)

(73) Assignee: MIRAIAL CO., LTD., Tokyo (JP)

(*) Notice: Subject to any disclaimer, the term of this patent is extended or adjusted under 35 U.S.C. 154(b) by 0 days.

(21) Appl. No.: 14/908,995

(22) PCT Filed: Aug. 1, 2013

(86) PCT No.: PCT/JP2013/070865
§ 371 (c)(1),
(2) Date: Jan. 29, 2016

(87) PCT Pub. No.: WO2015/015615
PCT Pub. Date: Feb. 5, 2015

(65) Prior Publication Data
US 2016/0196993 A1    Jul. 7, 2016

(51) Int. Cl.
*H01L 21/00*    (2006.01)
*H01L 21/673*   (2006.01)

(52) U.S. Cl.
CPC .. *H01L 21/67369* (2013.01); *H01L 21/67386* (2013.01)

(58) Field of Classification Search
CPC .... H01L 21/67369; B65D 5/12; B65D 5/5097
USPC ........................................ 206/591, 592, 710
See application file for complete search history.

(56) References Cited

U.S. PATENT DOCUMENTS

| | | | |
|---|---|---|---|
| 1,120,774 A | 12/1914 | Weiss | |
| 2,040,224 A * | 5/1936 | Usinger | B65D 5/12 229/122.3 |
| 5,706,951 A * | 1/1998 | Oinuma | H01L 21/67366 206/592 |
| 6,877,608 B2 * | 4/2005 | Koike | B65D 81/133 206/523 |
| 7,328,800 B2 * | 2/2008 | Koike | B65D 5/5088 206/521 |
| 7,748,539 B2 * | 7/2010 | Onda | H01L 21/67369 206/521 |
| 9,455,168 B2 * | 9/2016 | Horio | H01L 21/67369 |

(Continued)

FOREIGN PATENT DOCUMENTS

| | | |
|---|---|---|
| JP | 51-139172 U | 11/1976 |
| JP | 53-135279 U | 10/1978 |

(Continued)

*Primary Examiner* — Ernesto A Grano
(74) *Attorney, Agent, or Firm* — Muncy, Geissler, Olds & Lowe, P.C.

(57) ABSTRACT

An upper cushioning material is placed on a substrate storing container in a packing box. The substrate storing container is placed on a lower cushioning material. The lower cushioning material is disposed in the packing box in such a manner that the substrate storing container is sandwiched in the vertical direction by an upper cushioning material and the lower cushioning material. Furthermore, the lower cushioning material is not in contact with any of a first side plate, a second side plate, a front plate and a back plate of the packing box, and a lower space is formed between the lower cushioning material and the first side plate, the second side plate, the front plate and the back plate of the packing box.

7 Claims, 18 Drawing Sheets

(56) References Cited

U.S. PATENT DOCUMENTS

| | | | | |
|---|---|---|---|---|
| 2001/0020595 A1* | 9/2001 | Koike | ................. | B65D 81/025 |
| | | | | 206/521 |
| 2003/0234207 A1* | 12/2003 | Koike | ................. | B65D 5/4204 |
| | | | | 206/588 |
| 2005/0236298 A1* | 10/2005 | Schwenk | .......... | H01L 21/67366 |
| | | | | 206/710 |
| 2009/0166248 A1* | 7/2009 | Onda | ................ | H01L 21/67369 |
| | | | | 206/587 |
| 2014/0083902 A1* | 3/2014 | Huang | .............. | H01L 21/67369 |
| | | | | 206/710 |

FOREIGN PATENT DOCUMENTS

| | | |
|---|---|---|
| JP | 58-159268 U | 10/1983 |
| JP | 7-307378 A | 11/1995 |
| JP | 3019701 U | 1/1996 |
| JP | 63-197830 U | 12/1998 |
| JP | 2003-26232 A | 1/2003 |
| JP | 2004-168324 A | 6/2004 |
| JP | 2010-132331 A | 6/2010 |
| TW | M452156 U | 5/2013 |

\* cited by examiner

PACKING STRUCTURE FOR PACKING SUBSTRATE STORING CONTAINER

TECHNICAL FIELD

The present invention relates to a packing structure for packing a substrate storing container that stores substrates such as semiconductor wafers.

BACKGROUND ART

As a container that stores substrates such as semiconductor wafers, a substrate storing container has been known conventionally that has a container main body and a lid body. When such a substrate storing container is packed in a packing box for transportation, a resin cushioning material and the like is arranged in the packing box. Then, this retains the substrate storing container in the packing box and reduces the transfer of impact or vibration to the substrate storing container from outside of the packing box (refer to Japanese Unexamined Patent Application, Publication No. H07-307378).

Patent Document 1: Japanese Unexamined Patent Application, Publication No. H07-307378

DISCLOSURE OF THE INVENTION

Problems to be Solved by the Invention

The vibration in a vertical direction transfers via a cushioning material from a bottom plate or a side plate of a packing box. For this reason, a packing structure has been demanded which reduces vibration transfer to a substrate storing container more than a packing structure using a conventional cushioning material.

It is an object of the present invention to provide a packing structure for packing a substrate storing container which can suppress vibration from being transferred to a plurality of substrates stored in the substrate storing container during the transport of the substrate storing container as much as possible.

Means for Solving the Problems

The present invention relates to a packing structure for packing a substrate storing container for storing and transporting substrates composed of semiconductor wafers, including: a packing box in a cuboid shape having a first side plate, a second side plate, a front plate, a back plate, a top plate, and a bottom plate; an upper cushioning material that is placed on the upper portion of the substrate storing container in the packing box; a lower cushioning material on which the substrate storing container is placed, and which is disposed in the packing box in such a manner that the substrate storing container is sandwiched by the upper cushioning material and the lower cushioning material in a vertical direction; and an elastic support member which is disposed in the packing box, is elastically deformable, is supported by a bottom plate of the packing box, and supports the lower cushioning material, in which the lower cushioning material is not in contact with any of the first side plate, the second side plate, the front plate, and the back plate of the packing box, and a lower space is formed between the lower cushioning material and the first side plate, the second side plate, the front plate and the back plate of the packing box.

Furthermore, it is preferable that the upper cushioning material is in contact with a top plate of the packing box. Alternatively, it is preferable that the upper cushioning material is not in contact with the packing box, and an upper space is formed between the upper cushioning material and the top plate of the packing box.

Furthermore, it is preferable that the upper cushioning material is in contact with the first side plate, the second side plate, the front plate, and the back plate of the packing box. Alternatively, it is preferable that the upper cushioning material is not in contact with any of the first side plate, the second side plate, the front plate, and the back plate of the packing box, and an upper space is formed between the upper cushioning material and the first side plate, the second side plate, the front plate and the back plate of the packing box.

Furthermore, it is preferable that the packing box is configured from a lower lid having the bottom plate, a sleeve member which is configured from the first side plate, the second side plate, the front plate, and the back plate and which has a square cylinder shape having an axial center extending in a vertical direction, and an upper lid having the top plate, in which a lower end portion of the sleeve member is placed on the bottom plate of the lower lid, and the top plate of the upper lid is placed on an upper end portion of the sleeve member.

Furthermore, it is preferable that the packing structure further includes a rigid body which is disposed in the packing box and has a plate shape having a planar upper face and a planar lower face, wherein the upper face of the rigid body supports the lower cushioning material, and the lower face of the rigid body abuts an upper end portion of the elastic support member and is supported by the elastic support material, in which the rigid body has rigidity which can suppress deformation of the lower cushioning material and support the lower cushioning material when the substrate storing container is placed at the lower cushioning material, and is not in contact with the first side plate, the second side plate, the front plate, and the back plate of the packing box, wherein a space is formed between the rigid body and the first side plate, the second side plate, the front plate, and the back plate of the packing box, and in which the upper end portion of the elastic support member indirectly supports the lower cushioning material via the rigid body.

Furthermore, it is preferable that the elastic support member is configured by any of a coil spring, air spring, gel, sponge, rubber, and polymeric foam having elasticity.

Effects of the Invention

According to the present invention, it is possible to provide a packing structure for packing a substrate storing container which can suppress vibration from being transferred to a plurality of substrates stored in the substrate storing container during the transport of the substrate storing container as much as possible.

PREFERRED MODE FOR CARRYING OUT THE INVENTION

Figure 1:
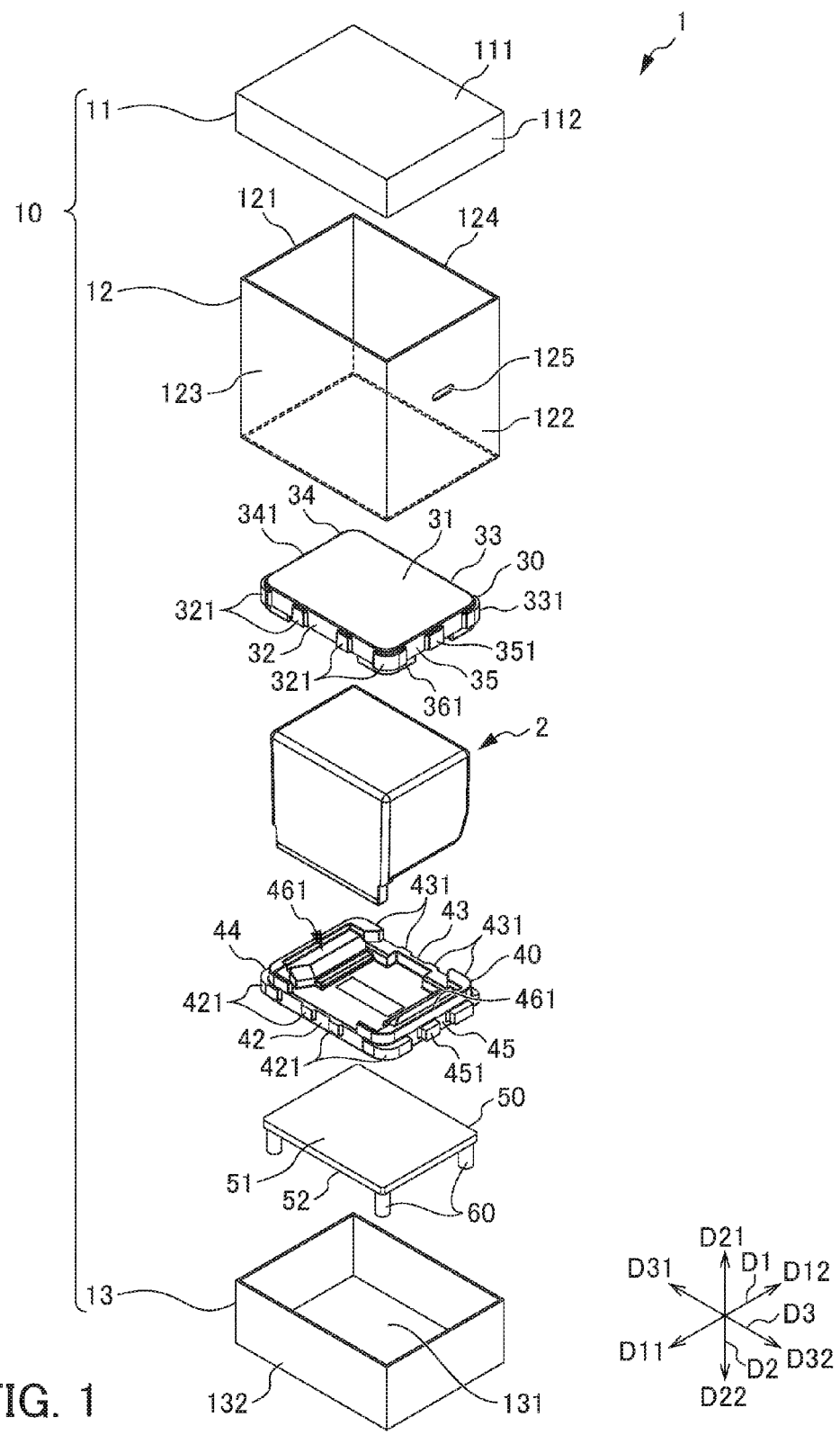
FIG. 1 is an exploded perspective view illustrating a packing structure 1 for packing a substrate storing container 2 according to the first embodiment of the present invention.
Figure 2A:
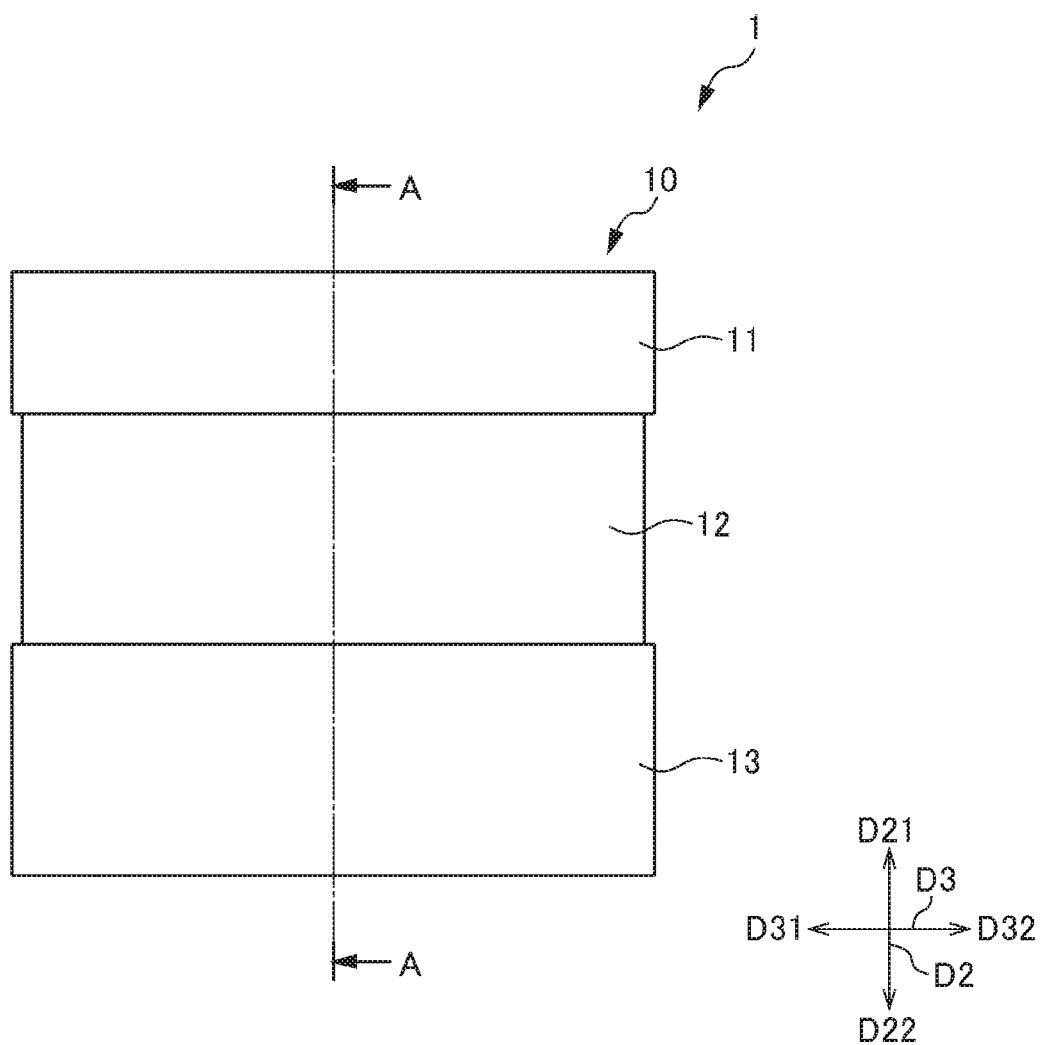
FIG. 2A is a front view illustrating the packing structure 1 for packing the substrate storing container 2 according to the first embodiment of the present invention.
Figure 2B:
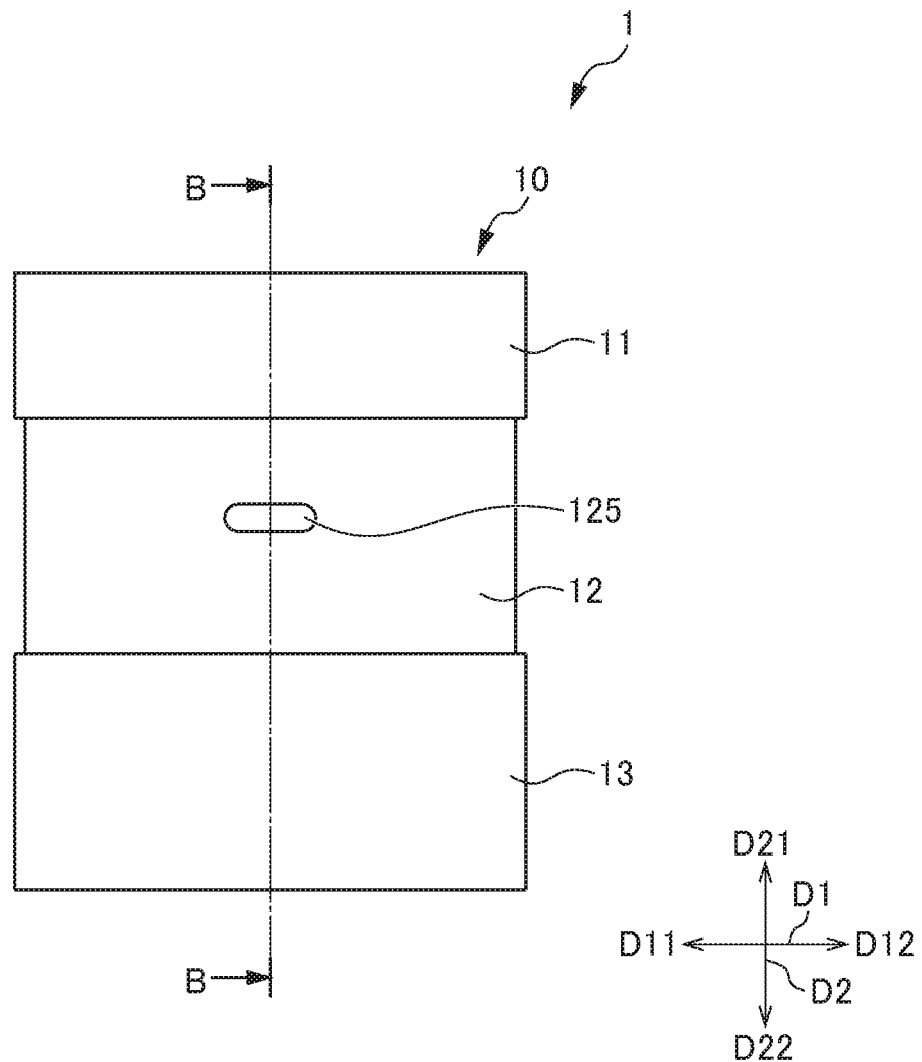
FIG. 2B is a side view illustrating the packing structure 1 for packing the substrate storing container 2 according to the first embodiment of the present invention.
Figure 3A:
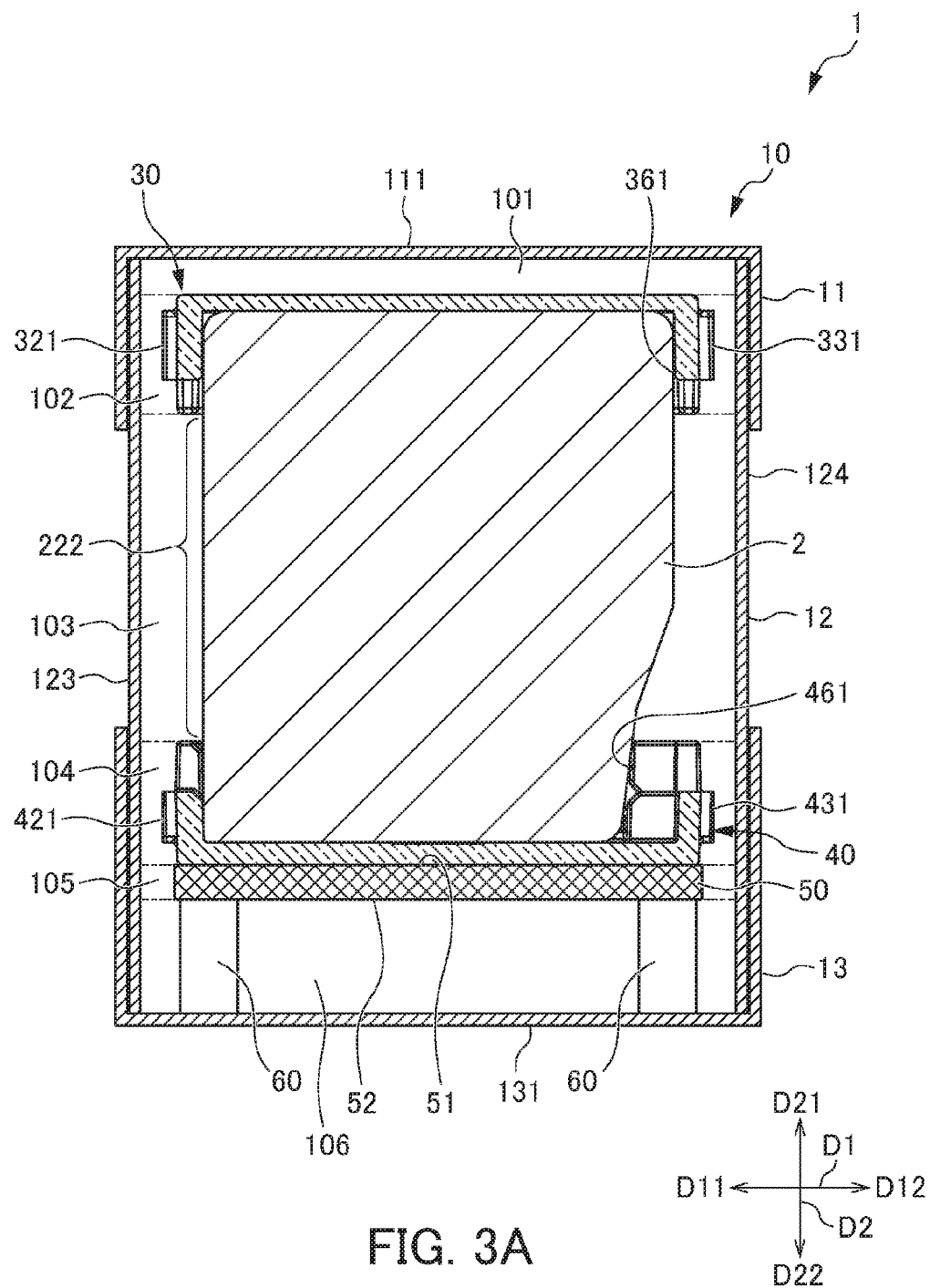
FIG. 3A is a cross-sectional view along the line A-A in FIG. 2A.
Figure 3B:
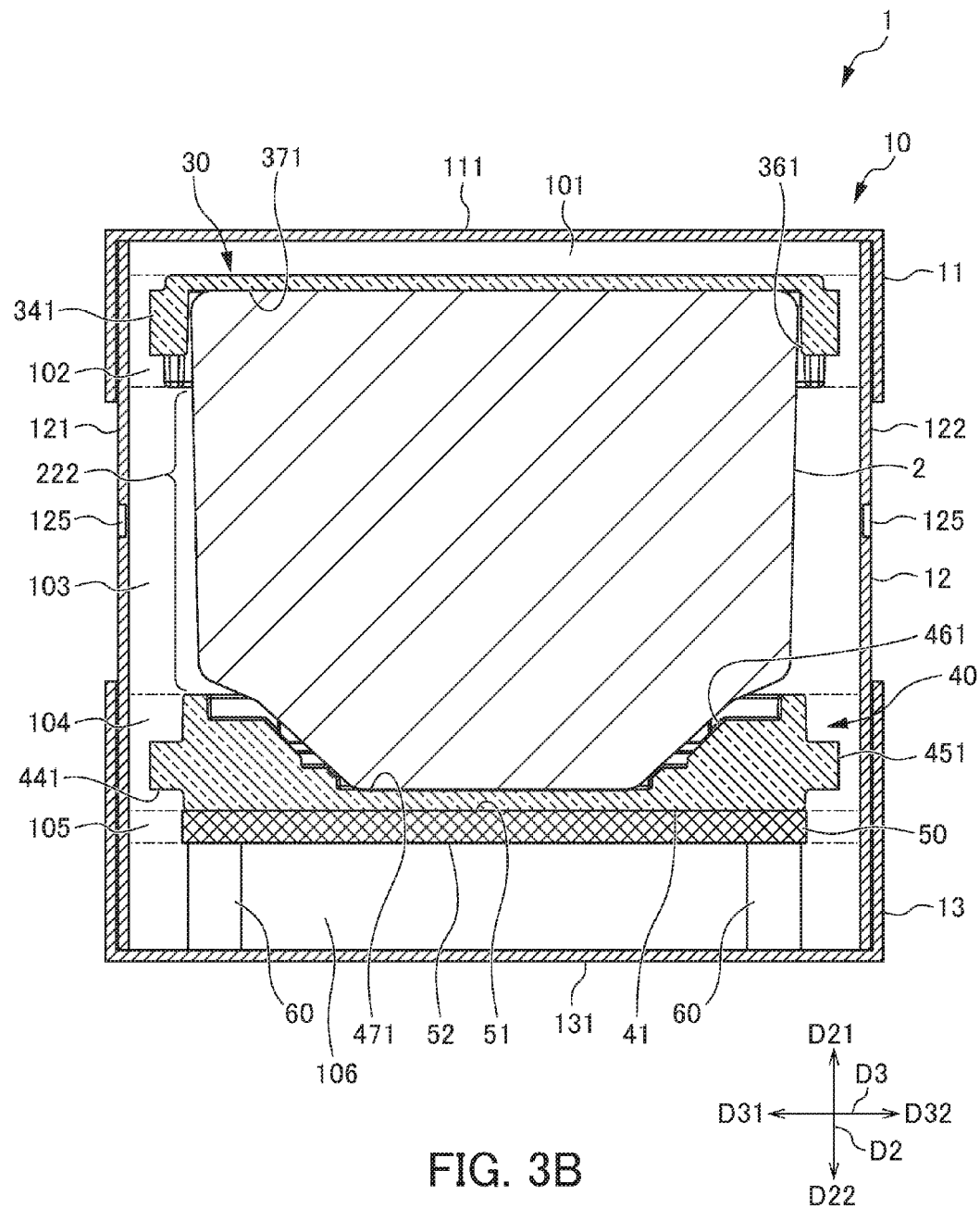
FIG. 3B is a cross-sectional view along the line B-B in FIG. 2B.
Figure 4:
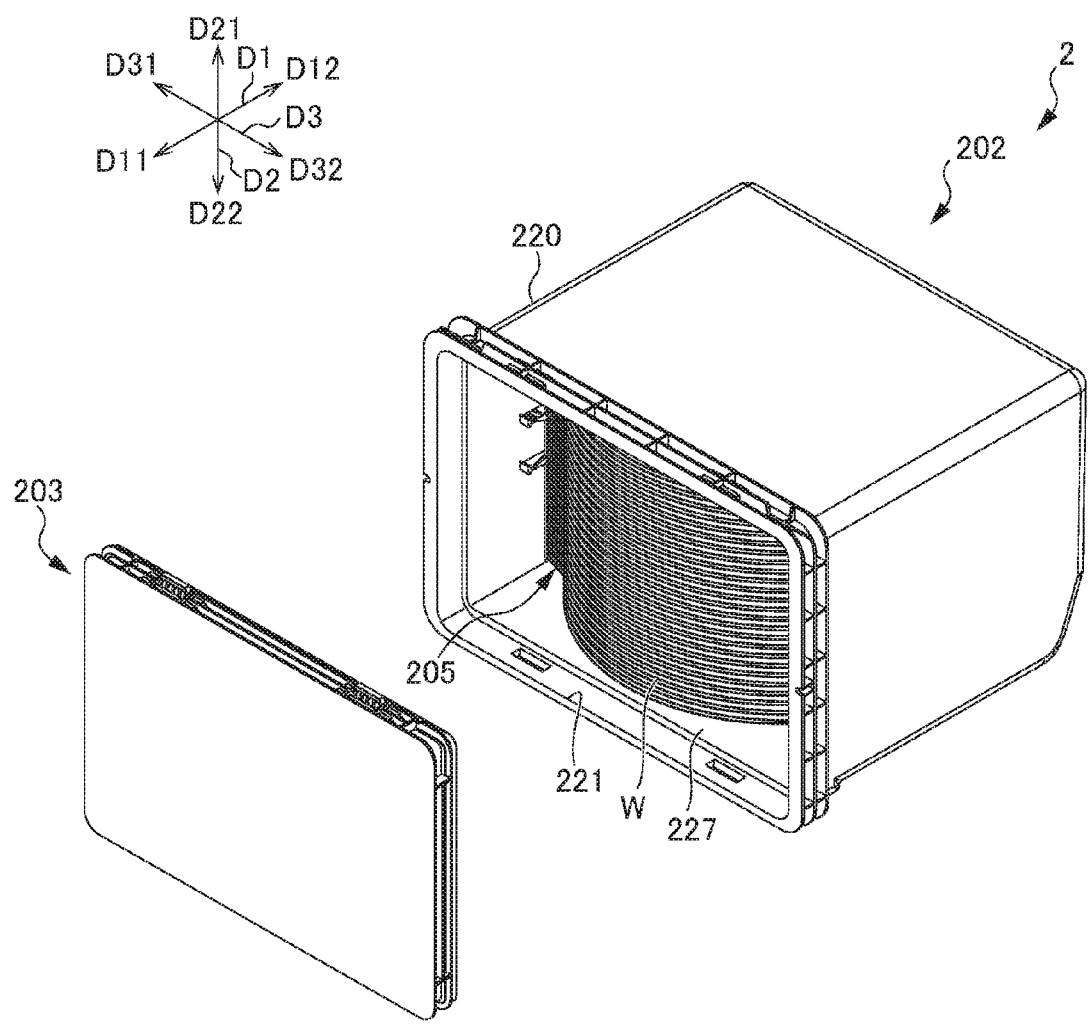
FIG. 4 is an exploded perspective view illustrating the substrate storing container 2 packed by the packing structure 1 according to the first embodiment of the present invention.

In the following, a packing structure 1 for packing a substrate storing container according to a first embodiment of the present invention will be described with reference to the drawings. FIG. 1 is an exploded perspective view illustrating a packing structure 1 for packing a substrate storing container 2 according to the first embodiment of the present invention. FIG. 2A is a front view illustrating the packing structure 1 for packing the substrate storing container 2 according to the first embodiment of the present invention. FIG. 2B is a side view illustrating the packing structure 1 for packing the substrate storing container 2 according to the first embodiment of the present invention. FIG. 3A is a cross-sectional view along the line A-A in FIG. 2A. FIG. 3B is a cross-sectional view along the line B-B in FIG. 2B. FIG. 4 is an exploded perspective view illustrating the substrate storing container 2 packed by the packing structure 1 according to the first embodiment of the present invention.

Herein, for the convenience of explanation, the direction from a back plate 124 toward a front plate 123 of a packing box 10 (described later) (lower left direction in FIG. 1) is defined as a forward direction D11, and the opposite direction to the direction D11 is defined as a backward direction D12. Furthermore, these directions are defined as a forward/backward direction D1. Furthermore, the direction from a bottom plate 131 toward a top plate 111 (described later) (upper direction in FIG. 1) is defined as an upper direction D21, and the direction opposite to the direction D21 is defined as a lower direction D22. In addition, these directions are defined as an upper/lower direction D2. Furthermore, the direction from a second side plate 122 toward a first side plate 121 (described later) (upper left direction in FIG. 1) is defined as a left direction D31, and the direction opposite to the direction D31 is defined as a right direction D32. Furthermore, these directions are defined as a left/right direction D3.

As illustrated in FIG. 4, the substrate storing container 2 packed by the packing structure 1 stores and transports substrates W composed of semiconductor wafers and includes a container main body 202 and a lid body 203. It should be noted that, in FIGS. 3A and 3B, for the purpose of convenience, the illustration of the inside of the substrate storing container 2 is omitted.

The container main body 202 has a tubular wall portion 220 with a container main body opening portion 221 formed at one end and the other end closed. A substrate storing space 227 is formed in the container main body 202. The substrate storing space 227 is formed to be surrounded by the wall portion 220. A substrate support plate-like portion 205 and a rear retainer (not illustrated) are arranged at a part that is a part of the wall portion 220 and forming the substrate storing space 227. A plurality of substrates W can be stored in the substrate storing container 227.

The substrate support plate-like portion 205 is provided at the wall portion 220 so as to form a pair in the substrate storing space 227. When the container main body opening portion 221 is not closed by the lid body 203, the substrate support plate-like portion 205 can support edge portions of the plurality of substrates W in a state in which adjacent substrates W are arranged in parallel to be spaced apart by a predetermined interval. The rear retainer (not illustrated) can support rear portions of the edge portions of the plurality of substrates W when the container main body opening portion 221 is closed by the lid body 203.

The lid body 203 can be removably attached to the container main body opening portion 221 and can close the container main body opening portion 221. A front retainer (not illustrated) is provided at the lid body 203. The front retainer (not illustrated) is a part of the lid body 203 and provided at a part facing a portion which faces the substrate storing space 227 when the container main body opening portion 221 is closed by the lid body 203. The front retainer (not illustrated) is arranged so as to form a pair with the rear retainer (not illustrated).

The front retainer (not illustrated) can support front portions of the edge portions of the plurality of substrates W when the container main body opening portion 221 is closed by the lid body 203. The front retainer (not illustrated) retains the plurality of substrates W in a state in which adjacent substrates W are arranged in parallel to be spaced apart by a predetermined interval by supporting the plurality of substrates W in cooperation with the rear retainer (not illustrated) when the container main body opening portion 221 is closed by the lid body 203.

The substrates W (refer to FIG. 4) stored in the substrate storing container 2 is a disk-like silicon wafer, glass wafer, sapphire wafer, etc., and is a thin member used for industrial use. The substrates W according to the present embodiment are silicon wafers having a diameter of 300 mm to 450 mm.

As illustrated in FIG. 1, the packing structure 1 for packing the substrate storing container 2 includes a packing box 10, an upper cushioning material 30, a lower cushioning material 40, a rigid body 50, and a coil spring 60 as an elastic support member. The packing structure 1 packs the substrate storing container 2 for storing and transporting the substrates W composed of semiconductor wafers.

As illustrated in FIGS. 1, 2A, etc., the packing box 10 includes an upper lid 11, a sleeve member 12, and a lower lid 13 composed of a so-called plastic card board box (corrugated plastic, also known as "pladan"), respectively, and has a cuboid shape as a whole.

The upper lid 11 has the top plate 111 and an upper lid peripheral wall 112. The top plate 111 has a rectangular shape. The upper lid peripheral wall 112 has four pieces in a rectangular plate-like shape that extend from the periphery of the top plate 111 in the lower direction D22, and one end thereof is closed by the top plate 111 and the other end is open and has a square cylinder shape.

The sleeve member 12 is configured with the first side plate 121, the second side plate 122, the front plate 123, and the back plate 124 having a rectangular shape, respectively, has a shaft center extending in the upper/lower direction, and has a square cylinder shape with both ends open. Through-holes 125 in an oval shape which are made long in the forward/backward direction are formed at the first side plate 121 and the second side plate 122 of the sleeve member 12, respectively. An operator can pick up the sleeve member 12 by inserting a hand into the through-hole 125.

The lower lid 13 has the bottom plate 131 and a lower lid peripheral wall 132. The bottom plate 131 has a rectangular shape. The lower lid peripheral wall 132 has four pieces in a rectangular plate-like shape that extend from the periphery of the bottom plate 131 above, and one end thereof is closed by the bottom plate 131 and the other end is open and has a square cylinder shape.

With a positional relationship in which the periphery of the upper end portion of the sleeve member 12 is surrounded by the upper lid peripheral wall 112, the top plate 111 of the upper lid 11 is placed at the upper end portion of the sleeve member 12. Furthermore, with a positional relationship in which the periphery of the lower end portion of the sleeve member 12 is surrounded by the lower lid peripheral wall 132, the lower end portion of the sleeve member 12 is placed on the bottom plate 131 of the lower lid 13. With such a configuration, the packing box 10 configured from the upper lid 11, the sleeve member 12, and the lower lid 13 is assembled.

The upper cushioning material 30 has rigidity which can retain the shape of the upper cushioning material 30 itself without being plastically deformed even when placing the substrate storing container 2 in which the substrates W are stored on the upper cushioning material 30 directly. Furthermore, the upper cushioning material 30 is made of a material having flexibility that can absorb at least a part of impact acting on the packing box 10 and is transferred to the substrate storing container 2 via the upper cushioning material 30. Therefore, the upper cushioning material 30 is plastically deformed and the shape no longer returns when impact stronger than a predetermined impact is received; however, it is possible to absorb impact weaker than a predetermined impact and not significantly deform with such an impact. The upper cushioning material 30 is softer than the rigid body 50. In the present embodiment, the upper cushioning material 30 is made of styrene foam.

The upper cushioning material 30 has a substantially cuboid shape. An upper face 31 of the upper cushioning material 30 is configured with a plane face. Four convex portions 321 project in the forward direction D11 at a side face 32 of a forward side of the upper cushioning material 30. Similarly, four convex portions 331 (refer to FIG. 3A) project in the backward direction D12 also at a side face 33 of a backward side of the upper cushioning material 30.

The convex portions 321 and 331 close to the center in the left/right direction D3 have a cuboid shape. Furthermore, the convex portions 321 and 331 at both ends in the left/right direction D3 have shapes that cover four corner portions of the upper cushioning material 30 in a substantially rectangular shape in a planar view. Therefore, the convex portions 321 and 331 at both ends in the left/right direction D3 project from the left and right side faces 34, 35 of the upper cushioning material 30 also in the left/right direction D3.

Furthermore, a convex portion 341 in a cuboid shape projects in the left direction D31 at the left side face 34 of the upper cushioning material 30. Similarly, a convex portion 351 in a cuboid shape projects in the right direction D32 at the right side face 35 of the upper cushioning material 30.

Furthermore, a convex portion 361 that projects in the lower direction D22 is provided at a lower face of the upper cushioning material 30. Therefore, a lower portion of the upper cushioning material 30 has a concave portion 371 (refer to FIG. 3B, etc.) which is relatively indented upwards in relation to the convex portion 361. The concave portion 371 has a shape which is substantially the same as the shape of an upper portion of the lid body 203 and an upper portion of the container main body 202 of the substrate storing container 2. By the upper cushioning material 30 being placed on the upper portion of the substrate storing container 2, the concave portion 371 is engaged with the upper portion of the lid body 203 and the upper portion of the container main body 202.

The upper face 31 of the upper cushioning material 30 does not abut the top plate 111 of the top lid 11 constituting the packing box 10. An upper space 101 (refer to FIG. 3B, etc.) is formed between the upper face 31 of the upper cushioning material 30 and the top plate 111 of the packing box 10.

The upper cushioning material 30 has a substantially cuboid shape which is smaller than the opening of the sleeve member 12. On the other hand, since the projecting amounts of the convex portions 321, 331, 341, and 351 are small, when the upper cushioning material 30 is disposed within the packing box 10, the convex portions 321, 331, 341, and 351 are not in contact with the first side plate 121, the second side plate 122, the front plate 123, and the back plate 124 that constitute the sleeve member 12. An upper space 102 (refer to FIG. 3B, etc.) is formed between the upper cushioning material 30 and the first side plate 121, the second side plate 122, the front plate 123, and the back plate 124 of the sleeve member 12 that constitutes the packing box 10.

The lower cushioning material 40 has rigidity which can retain the shape of the lower cushioning material 40 itself without being plastically deformed, even when placing the substrate storing container 2 in which the substrates W are stored on the lower cushioning material 40 directly. Furthermore, the lower cushioning material 40 is made of a material having flexibility that can absorb at least a part of impact acting on the packing box 10 and is transferred to the substrate storing container 2 via the lower cushioning material 40. In the present embodiment, the lower cushioning material 40 is made of styrene foam, which is the same material as that of the upper cushioning material 30.

The lower cushioning material 40 has a substantially cuboid shape. A lower face 41 of the lower cushioning material 40 (refer to FIG. 3B, etc.) is configured with a plane face. A convex portion 461 that projects in the upper direction D21 is provided at an upper face of the lower cushioning material 40. Therefore, an upper portion of the lower cushioning material 40 has a concave portion 471 (refer to FIG. 3B, etc.) which is relatively indented downwards in relation to the convex portion 461. The concave portion 471 has a shape which is substantially the same as the shape of the lower portion of the container main body 202 of the substrate storing container 2 and the concave portion 471 is engaged with the lower portion of the container main body 202.

In other words, the substrate storing container 2 is placed on the lower cushioning material 40, and thus the upper cushioning material 30, the lower cushioning material 40, and the substrate storing container 2 are disposed in the packing box 10 in such a manner that the substrate storing container 2 is sandwiched by the upper cushioning material 30 and the lower cushioning material 40 in the upper/lower direction D2.

Four convex portions 421 project in the forward direction D11 at a side face 42 of a forward side of the lower cushioning material 40. Similarly, four convex portions 431 (refer to FIG. 1) project in the backward direction D12 also at a side face 43 of a backward side of the lower cushioning material 40.

The convex portions 421 and 431 close to the center in the left/right direction D3 have a cuboid shape. Furthermore, the convex portions 421 and 431 at both ends in the left/right direction D3 have shapes that cover four corner portions of the lower cushioning material 40 in a substantially rectangular shape in a planar view. Therefore, the convex portions 421 and 431 at both ends in the left/right direction D3 project from the left and right side faces 44, 45 of the lower cushioning material 40 also in the left/right direction D3.

Furthermore, a convex portion 441 in a cuboid shape (refer to FIG. 3B, etc.) projects in the left direction D31 at the left side face 44 of the lower cushioning material 40. Similarly, a convex portion 451 in a cuboid shape projects in the right direction D32 at the right side face 45 of the lower cushioning material 40. The projecting amounts of the convex portions 421, 431, 441 and 451 from the side faces 44 and 45 in the left/right direction D3 is greater than the projecting amounts of the convex portions 321, 331, 341, and 351 of the upper cushioning material 30 from the side faces 34 and 35 in the same direction.

As illustrated in FIG. 3A, etc., in a positional relationship in parallel with the left/right direction D3 and the forward/backward direction D1, the lower cushioning material 40 is disposed below the substrate storing container 2 in the packing box 10 in such a manner that the lower face 41 of the lower cushioning material 40 abuts flush with an upper face 51 of the rigid body 50. The lower face 41 of the lower cushioning material 40 is fixed by means of double sided tape (not illustrated) at the upper face 51 of the rigid body 50.

The lower cushioning material 40 has a substantially cuboid shape which is smaller than the opening of the sleeve member 12 and also smaller than the upper cushioning material 30. On the other hand, since the projecting amounts of the convex portions 421, 431, 441, and 451 are not so great, when the lower cushioning material 40 is disposed within the packing box 10, the convex portions 421, 431, 441, and 451 are not in contact with the first side plate 121, the second side plate 122, the front plate 123, and the back plate 124 that constitute the sleeve member 12. A lower space 104 (refer to FIG. 3B, etc.) is formed between the lower cushioning material 40 and the first side plate 121, the second side plate 122, the front plate 123, and the back plate 124 of the sleeve member 12 that constitutes the packing box 10.

The rigid body 50 has rigidity which can suppress the deformation of the lower cushioning material 40 and support the lower cushioning material 40 when the substrate storing container 2 is placed at the lower cushioning material 40. In the present embodiment, the rigid body 50 is composed of a sheet of cardboard or a plastic plate. In other words, the rigid body 50 may not absorb vibration or impact by itself, and thus is configured with a material which is relatively rigid that can maintain the shape itself. Therefore, the rigid body 50 is more rigid than the upper cushioning material 30 and the lower cushioning material 40.

The rigid body 50 has a rectangular plate shape and this rectangular shape is smaller than the rectangular shape surrounded by the inner face of the sleeve member 12 at a cross section of the sleeve member 12 which is cut along faces in parallel with the left/right direction D3 and the forward/backward direction D1. Therefore, the rigid body 50 is not in contact with the first side plate 121, the second side plate 122, the front plate 123, and the back plate 124 of the sleeve member 12 constituting the packing box 10. A space 105 (refer to FIG. 3B) is formed between the rigid body 50 and the first side plate 121, the second side plate 122, the front plate 123, and the back plate 124 of the packing box 10 in the forward/backward direction D1 and the left/right direction D3.

The rigid body 50 has a planar upper face 51 and a planar lower face 52, and, in a positional relationship of the upper face 51 and the lower face 52 being in parallel with the left/right direction D3 and the forward/backward direction D1, the rigid body 50 is disposed below the lower cushioning material 40 in the packing box 10. The upper face 51 of the rigid body 50 abuts the lower face 41 serving as a lower end face of the lower cushioning material 40 to support the lower cushioning material 40. Furthermore, the lower face 52 of the rigid body 50 abuts the upper end portion of the coil spring 60 (described later) serving as an elastic support member and is supported by the coil spring 60.

As illustrated in FIG. 3B, in the packing box 10, the central part of the substrate storing container 2 in the upper/lower direction has a container central part 222 that directly faces the first side plate 121, the second side plate 122, the front plate 123, and the back plate 124 of the packing box 10 without going through the convex portion 361 of the upper cushioning material 30 and the convex portion 461 of the lower cushioning material 40. Therefore, an intermediate space 103 is formed between the container central part 222 and the first side plate 121, the second side plate 122, the front plate 123, and the back plate 124 of the packing box 10. The volume of the aforementioned upper space 102 differs from the volume of the intermediate space 103, and the volume of the intermediate space 103 is larger than the volume of the upper space 102. Similarly, the volume of the lower space 104 differs from the volume of the intermediate space 103, and the volume of the intermediate space 103 is larger than the volume of the lower space 104.

The coil springs 60 are arranged at the four corners of the rigid body 50 in the packing box 10. The coil spring 60 biases the rigid body 50 in the upper direction D21, and the upper portion of the coil spring 60 is fixed at the rigid body 50 in a state abutting with the lower face 52 of the rigid body 50. The lower end portion of the coil spring 60 is fixed in a state abutting with the bottom plate 131 of the lower lid 13. With such a configuration, the elastically deformable coil spring 60 is supported by the bottom plate 131 of the packing box 10 and the upper end portion of the coil spring 60 indirectly supports the lower cushioning material 40 via the rigid body 50. It should be noted that the coil springs 60 are illustrated in a simplified manner in the drawings.

According to the packing structure 1 for packing the substrate storing container 2 according to the first embodiment of the abovementioned configuration, it is possible to obtain the following effects.

The packing structure 1 for packing a substrate storing container 2 for storing and transporting substrates composed of semiconductor wafers, includes: a packing box 10 in a cuboid shape having a first side plate 121, a second side plate 122, a front plate 123, a back plate 124, a top plate 111, and a bottom plate 131; an upper cushioning material 30 that is placed on the upper portion of the substrate storing container 2 in the packing box; a lower cushioning material 40 on which the substrate storing container 2 is placed, and which is disposed in the packing box 10 in such a manner that the substrate storing container 2 is sandwiched by the upper cushioning material 30 and the lower cushioning material 40 in a vertical direction; and a coil spring 60 as an elastic support member which is disposed in the packing box 10, is elastically deformable, is supported by a bottom plate 131 of the packing box 10, and supports the lower cushioning material 40. Then, the lower cushioning material 40 is not in contact with any of the first side plate 121, the second side plate 122, the front plate 123, and the back plate 124 of the packing box 10, and a lower space 104 is formed between the lower cushioning material 40 and the first side plate 121, the second side plate 122, the front plate 123 and the back plate 124 of the packing box 10.

With such a configuration, when vibration in a vertical direction (the upper/lower direction D2) transfers via the lower cushioning material 40, it is possible to prevent the vibration from being transferred from the packing box 10 to a side face of the lower cushioning material 40 as vibration in the forward/backward direction D1 or the left/right direction D3. Due to this, it is possible to suppress the vibration in the vertical direction from being transferred to the substrates W stored in the substrate storing container 2 as vibration in the forward/backward direction D1 or the left/right direction D3 as much as possible, a result of which it is possible to suppress damage caused by the vibration to the substrates W as products. More specifically, it is possible to suppress damage to the substrates W as much as possible in a case of the substrates W composed of semiconductor wafers which are susceptible to the vibration in the forward/backward direction D1 or the left/right direction D3.

Furthermore, in a case in which the lower cushioning material 40 is in contact with the first side plate 121, the second side plate 122, the front plate 123, and the back plate 124 of the packing box 10, when the vibration which oscillates greatly in a vertical direction affects the packing box 10, the substrate storing container 2 and the lower cushioning material 40 jump upwards. With such a configuration, a space below the lower cushioning material 40, i.e. the space 105 and the lower space 106, are at negative pressure, and a space above the lower cushioning material 40, i.e. the intermediate space 103, the upper space 102, the upper space 101 are at positive pressure. The occurrence of this pressure difference increases the vibration. However, even in a case of such vibration acting, it is possible to flow air promptly in the lower space 104, and thus possible to suppress the occurrence of the pressure difference as much as possible.

Furthermore, the upper cushioning material 30 is not in contact with the top plate 111 of the packing box 10, and the upper space 101 is formed between the upper cushioning material 30 and the top plate 111 of the packing box 10. With such a configuration, it is possible to suppress the vibration in the vertical direction (the upper/lower direction D2) from being transferred from the top plate 111 via the upper cushioning material 30. Due to this, it is possible to suppress the vibration in the vertical direction from being transferred to the substrates W stored in the substrate storing container 2 as much as possible, a result of which it is possible to suppress damage caused by the vibration to the substrates W as products.

Furthermore, the upper cushioning material 30 is not in contact with any of the first side plate 121, the second side plate 122, the front plate 123, and the back plate 124 of the packing box 10, and the upper space 102 is formed between the upper cushioning material 30 and the first side plate 121, the second side plate 122, the front plate 123, and the back plate 124 of the packing box 10.

With such a configuration, when vibration in a vertical direction transfers via the upper cushioning material 30, it is possible to prevent the vibration from being transferred from the packing box 10 to a side face of the upper cushioning material 30 as vibration in the forward/backward direction D1 or the left/right direction D3. Due to this, it is possible to suppress the vibration in the vertical direction (the upper/lower direction D2) from being transferred from the first side plate 121, the second side plate 122, the front plate 123, and the back plate 124 via the upper cushioning material 30. Due to this, it is possible to suppress the vibration in the vertical direction from being transferred to the substrates W stored in the substrate storing container 2 as vibration as much as possible, a result of which it is possible to suppress damage caused by the vibration to the substrates W as products.

Furthermore, in a case in which the upper cushioning material 30 is in contact with the first side plate 121, the second side plate 122, the front plate 123, and the back plate 124 of the packing box 10, when the vibration which oscillates greatly in a vertical direction affects the packing box 10, the substrate storing container 2 and the upper cushioning material 30-sink downwards. With such a configuration, a space above the upper cushioning material 30, i.e. the upper space 101, is at negative pressure, and a space below the upper cushioning material 30, i.e. the intermediate space 103, the space 105, and the lower space 106, is at positive pressure. The occurrence of this pressure difference increases the vibration. However, even in a case of such vibration acting, it is possible to flow air promptly in the upper space 102, and thus possible to suppress the occurrence of the pressure difference as much as possible.

Furthermore, the packing box 10 is configured from a lower lid 13 having the bottom plate 131, a sleeve member 12 which is configured from the first side plate 121, second side plate 122, the front plate 123, and the back plate 124 and which has a square cylinder shape having an axial center extending in a vertical direction, and an upper lid 11 having the top plate 111, in which a lower end portion of the sleeve member 12 is placed on the bottom plate 131 of the lower lid 13, and the top plate 111 of the upper lid 11 is placed on an upper end portion of the sleeve member 12.

With such a configuration, by removing the upper lid 11 and the sleeve member 12 from the lower lid 13, it is possible to easily remove the substrate storing container 2 packed in the packing box 10 from the lower lid 13 of the packing box 10.

Furthermore, the packing structure 1 includes a rigid body 50 which is disposed in the packing box 10 and has a plate shape having a planar upper face 51 and a planar lower face 52, in which the upper face 51 of the rigid body 50 supports the lower cushioning material 40, and the lower face 52 of the rigid body 50 abuts an upper end portion of the coil spring 60 as an elastic support member and is supported by the coil spring 60. Then, the rigid body 50 has rigidity which can suppress deformation of the lower cushioning material 40 and support the lower cushioning material 40 when the substrate storing container 2 is placed at the lower cushioning material 40, and is not in contact with the first side plate 121, the second side plate 122, the front plate 123, and the back plate 124 of the packing box 10, in which a space 105 is formed between the rigid body 50 and the first side plate 121, the second side plate 122, the front plate 123, and the back plate 124 of the packing box 10. Then, the upper end portion of the coil spring 60 indirectly supports the lower cushioning material 40 via the rigid body 50.

With such a configuration, since the deformation of the lower cushioning material 40 is suppressed, it is possible to support the substrate storing container 2 stably. Furthermore, in a state in which four coil springs 60 serving as elastic support members are used and arranged at four corners of the rigid body 50 in the packing box 10, it is possible to efficiently bias the rigid body 50 in the upper direction D21 by way of the coil springs 60.

Furthermore, it is possible to prevent the vibration in the vertical direction from being transferred from the packing box 10 to a side face of the rigid body 50 as vibration in the forward/backward direction D1 or the left/right direction D3. For this reason, it is possible to suppress the vibration in the vertical direction (the upper/lower direction D2) from being transferred from the first side plate 121, the second side plate 122, the front plate, 123, and the front plate 124 via the rigid body 50. Due to this, it is possible to suppress the vibration in the vertical direction from being transferred to the substrates W stored in the substrate storing container 2 as much as possible, a result of which it is possible to suppress damage caused by the vibration to the substrates W as products.

Figure 5:
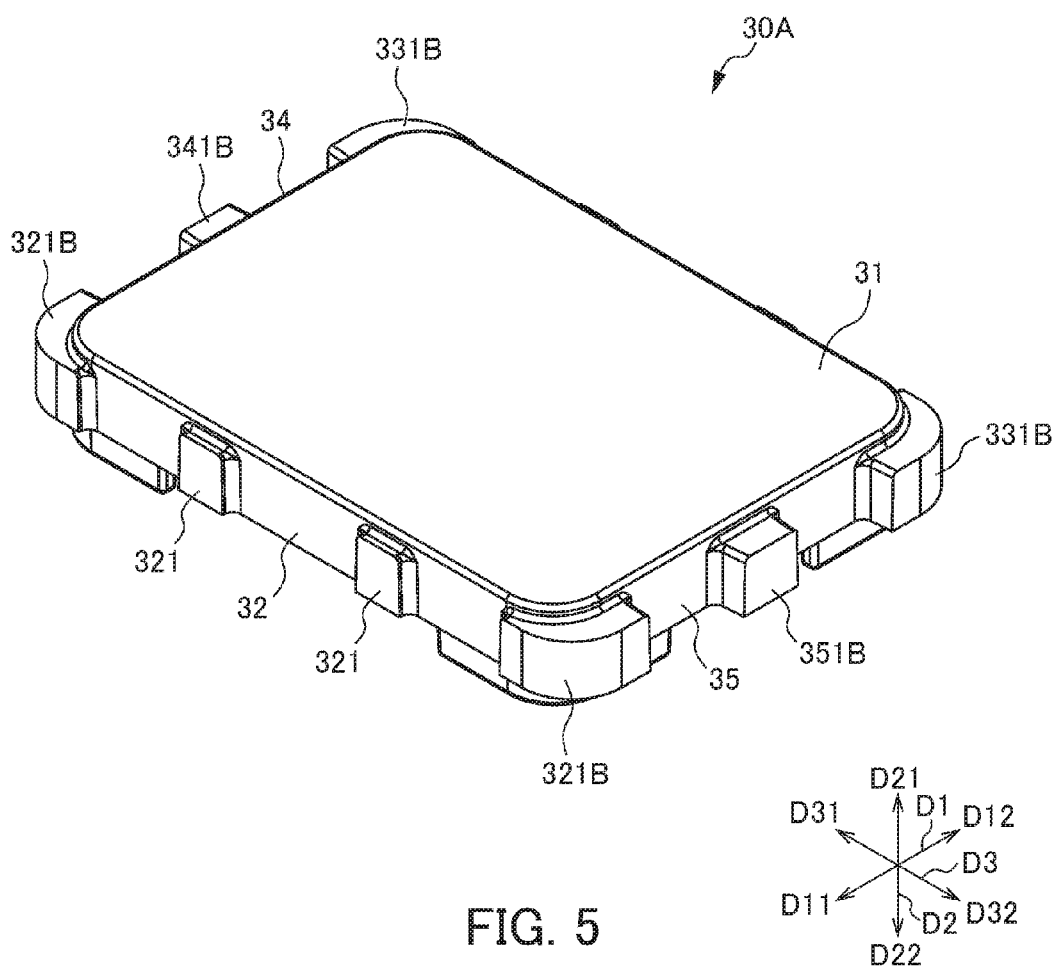
FIG. 5 is a perspective view illustrating an upper cushioning material 30A of a packing structure 1A for packing the substrate storing container 2 according to the second embodiment of the present invention.
Figure 6:
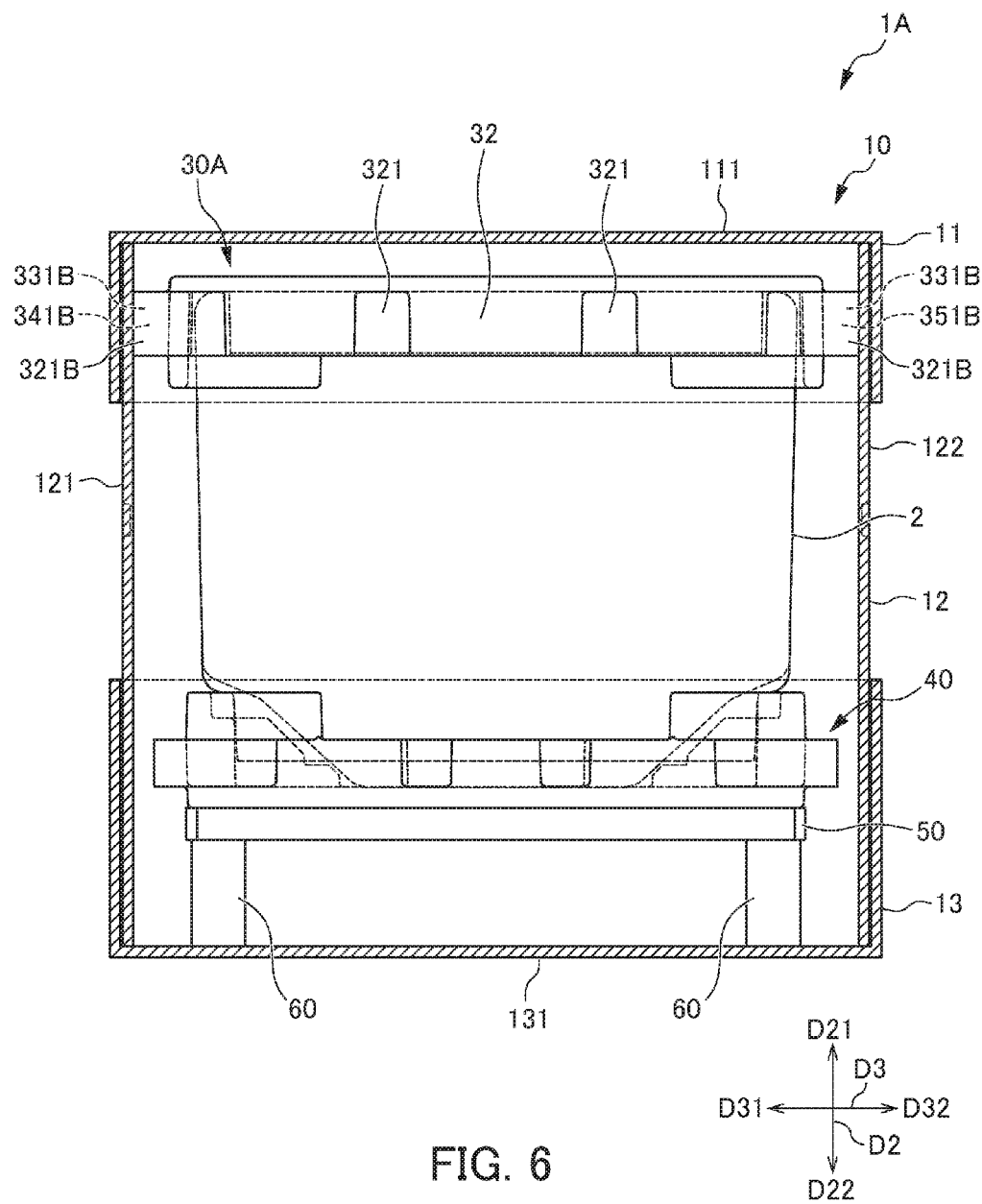
FIG. 6 is a cross-sectional view illustrating the packing structure 1A for packing the substrate storing container 2 according to the second embodiment of the present invention.

In the following, a packing structure 1A for packing a substrate storing container 2 according to the second embodiment of the present application will be described. FIG. 5 is a perspective view illustrating an upper cushioning material 30A of a packing structure 1A for packing the substrate storing container 2 according to the second embodiment of the present invention. FIG. 6 is a cross-sectional view illustrating the packing structure 1A for packing the substrate storing container 2 according to the second embodiment of the present invention.

The second embodiment is different from the first embodiment in the point that the shape of the upper cushioning material 30A is different from the shape of the upper cushioning material 30. Regarding the configuration other than this, since the second embodiment is the same as the first embodiment, the same members are illustrated with the same reference numerals, and the descriptions thereof will be omitted.

The projecting amounts of the convex portions 321B, 331B, 341B, and 351B that project at the left side face 34 and the right side face 35 of the upper cushioning material 30A, respectively, are greater than the projecting amounts of the convex portions 321, 331, 341, and 351 of the first embodiment that project in the same direction. Due to this, as illustrated in FIG. 6, the convex portions 321B, 331B, and 341B are in contact with the first side plate 121 of the packing box 10, and the convex portions 321B, 331B, and 351B are in contact with the second side plate 122 of the packing box 10.

According to the packing structure 1A for packing the substrate storing container 2 according to the second embodiment with the abovementioned configuration, the following effects can be obtained. As described above, since the convex portions 321B, 331B, 341B, and 351B are in contact with the first side plate 121 and the second side plate 122 of the packing box 10, the upper cushioning material 30A is in contact with the first side plate 121 and the second side plate 122 of the packing box 10. For this reason, it is possible to support the upper cushioning material 30A in the left/right direction D3 by way of the first side plate 121 and the second side plate 122, and thus it is possible to suppress the upper cushioning material 30A from being vibrated in the left/right direction D3.

Figure 7:
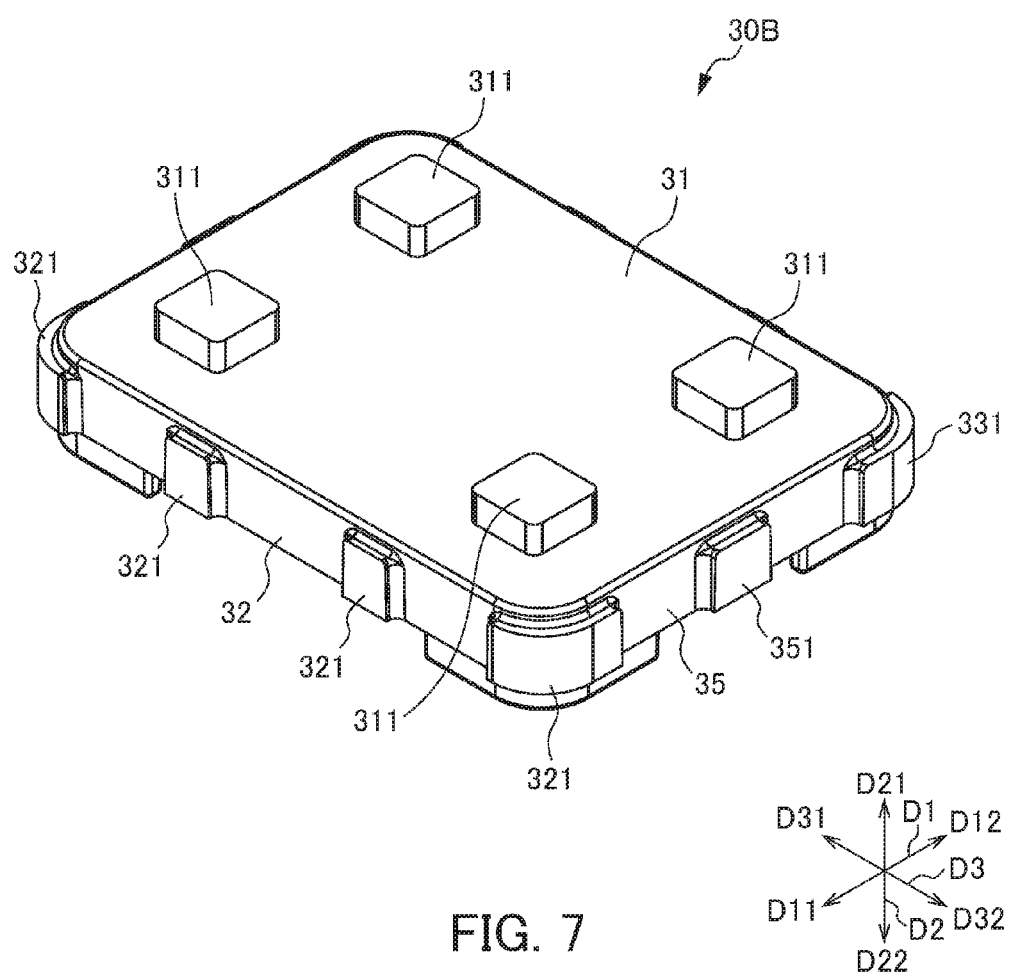
FIG. 7 is a perspective view illustrating an upper cushioning material 30B of a packing structure 1B for packing a substrate storing container 2 according to the third embodiment of the present invention.
Figure 8:
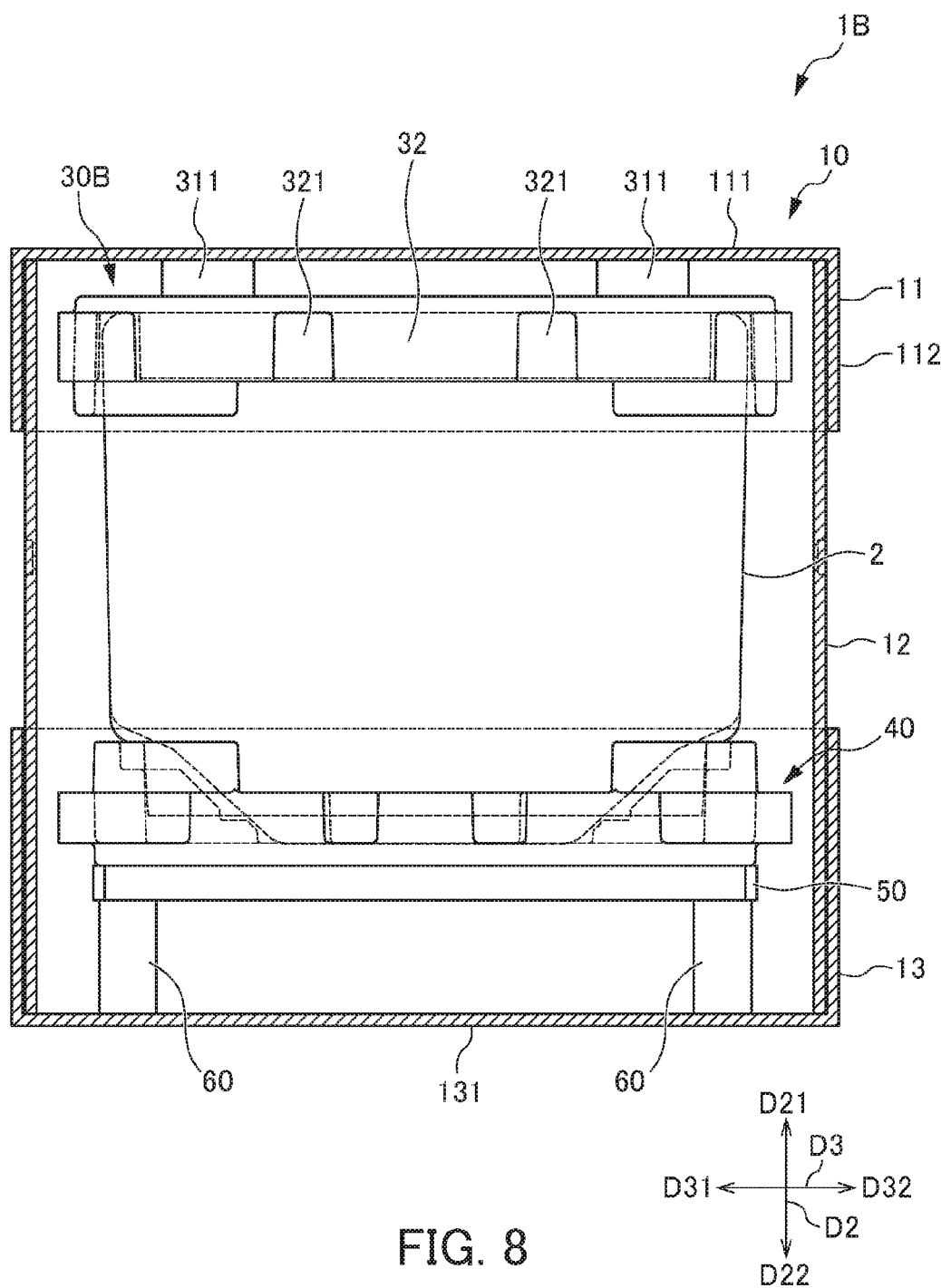
FIG. 8 is a cross-sectional view illustrating the packing structure 1B for packing the substrate storing container 2 according to the third embodiment of the present invention.

In the following, a packing structure 1B for packing a substrate storing container 2 according to the third embodiment of the present application will be described. FIG. 7 is a perspective view illustrating an upper cushioning material 30B of a packing structure 1B for packing a substrate storing container 2 according to the third embodiment of the present invention. FIG. 8 is a cross-sectional view illustrating the packing structure 1B for packing the substrate storing container 2 according to the third embodiment of the present invention.

The third embodiment is different from the first embodiment in the point that the shape of the upper cushioning material 30B is different from the shape of the upper cushioning material 30. Regarding configurations other than this, since the third embodiment is the same as the first embodiment, the same members are illustrated with the same reference numerals, and the descriptions thereof will be omitted.

Upward projecting convex portions 311 exist on an upper face 31 of the upper cushioning material 30B. The upward projecting convex portions 311 are formed in the proximity of the four corners of the upper face 31 of the upper cushioning material 30B in a substantially rectangular shape and have the same cuboid shape that projects above. Due to this, as illustrated in FIG. 8, the upward projecting convex portion 311 is in contact with the top plate 111 of the packing box 10.

According to the packing structure 1B for packing the substrate storing container 2 according to the third embodiment with the abovementioned configuration, the following effects can be obtained. As described above, the upper cushioning material 30B is in contact with the top plate 111 of the packing box 10. With such a configuration, by means of the top plate 111, it is possible to suppress the upper cushioning material 30B, the substrate storing container 2, the lower cushioning material 40, and the rigid body 50 from moving up and down due to the vibration in the vertical direction (the upper/lower direction D2).

Figure 9:
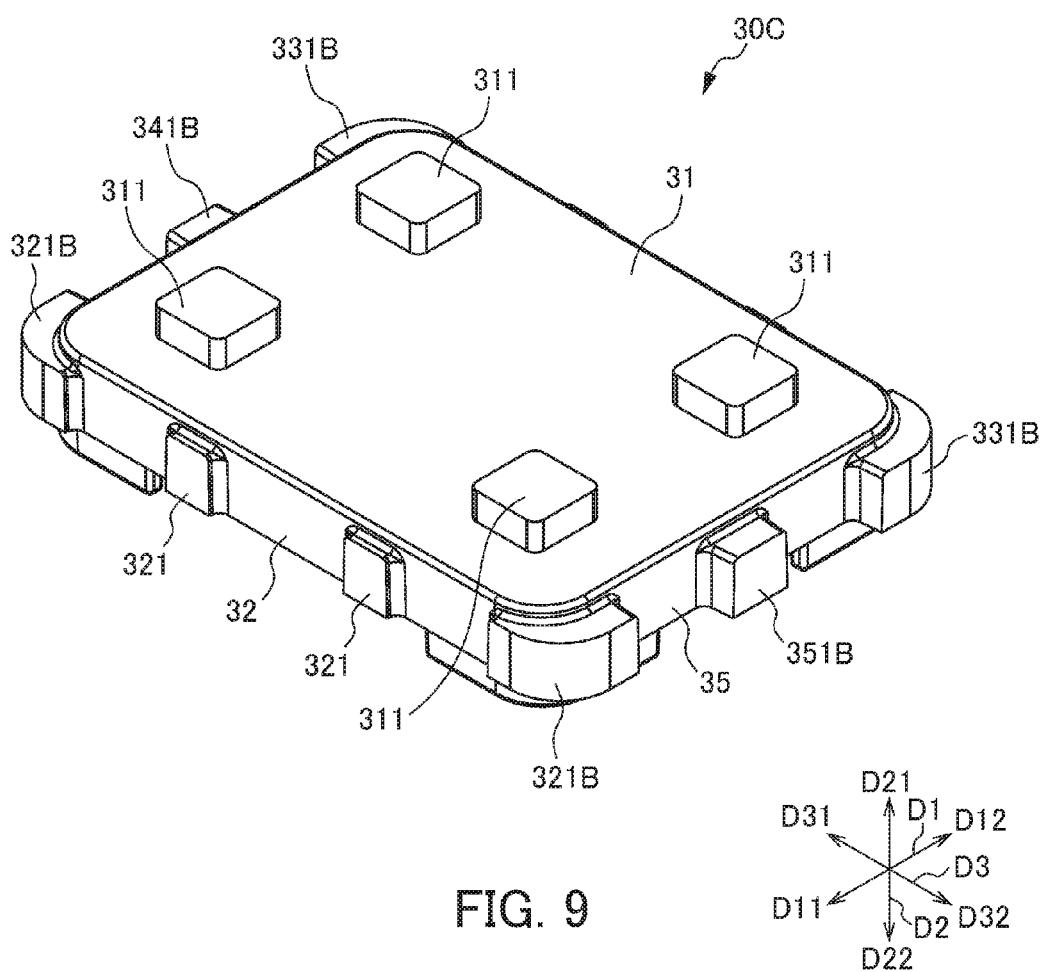
FIG. 9 is a perspective view illustrating an upper cushioning material 30C of a packing structure 1C for packing a substrate storing container 2 according to the fourth embodiment of the present invention.
Figure 10:
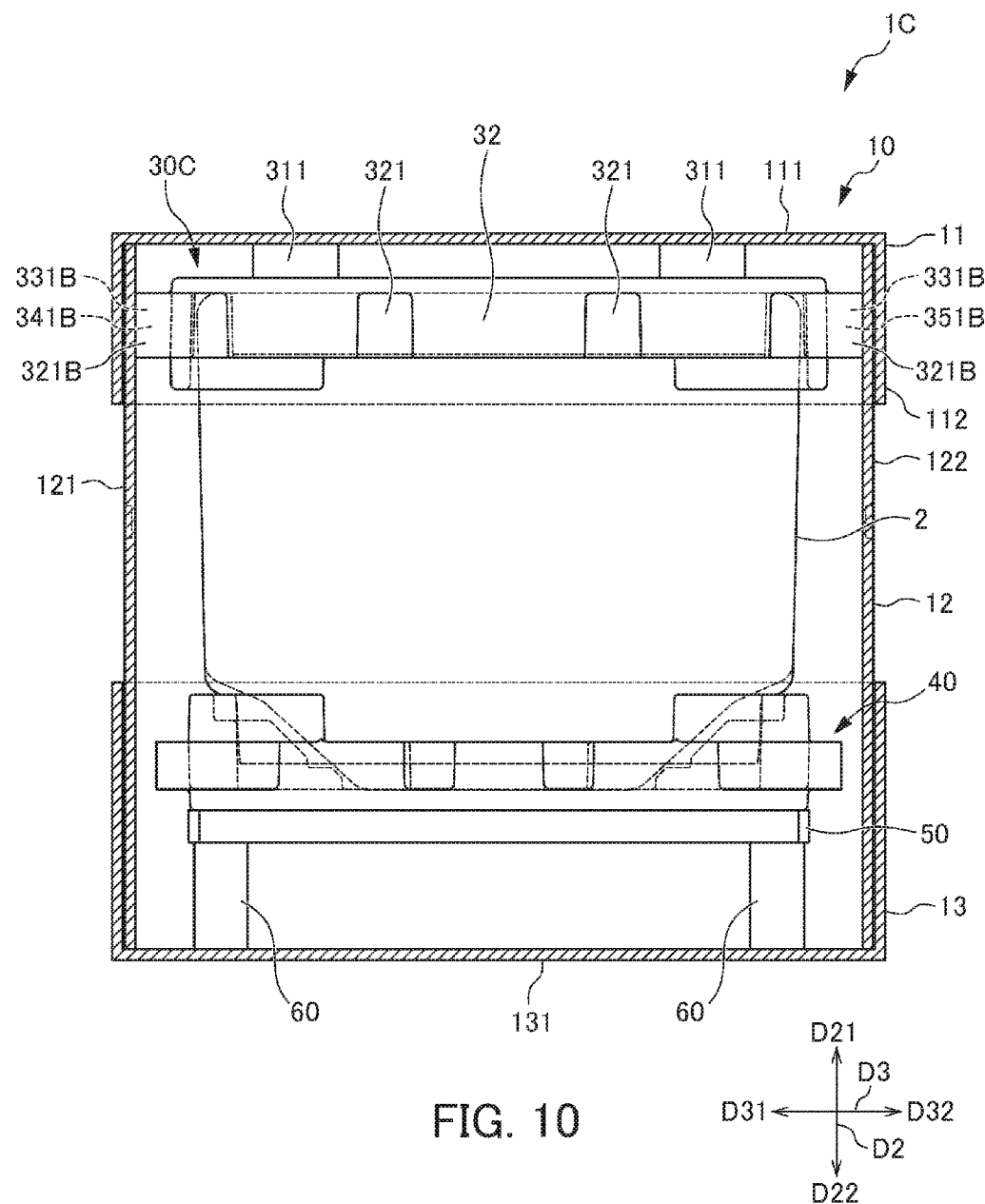
FIG. 10 is a cross-sectional view illustrating the packing structure 1C for packing the substrate storing container 2 according to the fourth embodiment of the present invention.

In the following, a packing structure 1C for packing a substrate storing container 2 according to the fourth embodiment of the present application will be described. FIG. 9 is a perspective view illustrating an upper cushioning material 30C of a packing structure 1C for packing a substrate storing container 2 according to the fourth embodiment of the present invention. FIG. 10 is a cross-sectional view illustrating the packing structure 1C for packing the substrate storing container 2 according to the fourth embodiment of the present invention.

The fourth embodiment is different from the second embodiment in the point that the shape of the upper cushioning material 30C is different from the shape of the upper cushioning material 30A. Regarding configurations other than this, since the fourth embodiment is the same as the second embodiment, the same members are illustrated with the same reference numerals, and the descriptions thereof will be omitted.

Upward projecting convex portions 311 exist on an upper face 31 of the upper cushioning material 30C. The upward projecting convex portions 311 are formed in the proximity of the four corners of the upper face 31 of the upper cushioning material 30C in a substantially rectangular shape and have the same cuboid shape that projects above. Due to this, as illustrated in FIG. 10, the upward projecting convex portion 311 is in contact with the top plate 111 of the packing box 10, and, similarly to the second embodiment, the convex portions 321B, 331B, and 341B are in contact with the first side plate 121 of the packing box 10, and the convex portions 321B, 331B, and 351B are in contact with the second side plate 122 of the packing box 10.

According to the packing structure 1C for packing the substrate storing container 2 according to the fourth embodiment with the abovementioned configuration, it is possible to support the upper cushioning material 30C in the left/right direction D3 by way of the first side plate 121 and the second side plate 122, and thus it is possible to suppress the upper cushioning material 30C from being vibrated in the left/right direction D3. Furthermore, by means of the top plate 111, it is possible to suppress the upper cushioning material 30C, the substrate storing container 2, the lower cushioning material 40, and the rigid body 50 from moving up and down due to the vibration in the vertical direction (the upper/lower direction D2).

Figure 11:
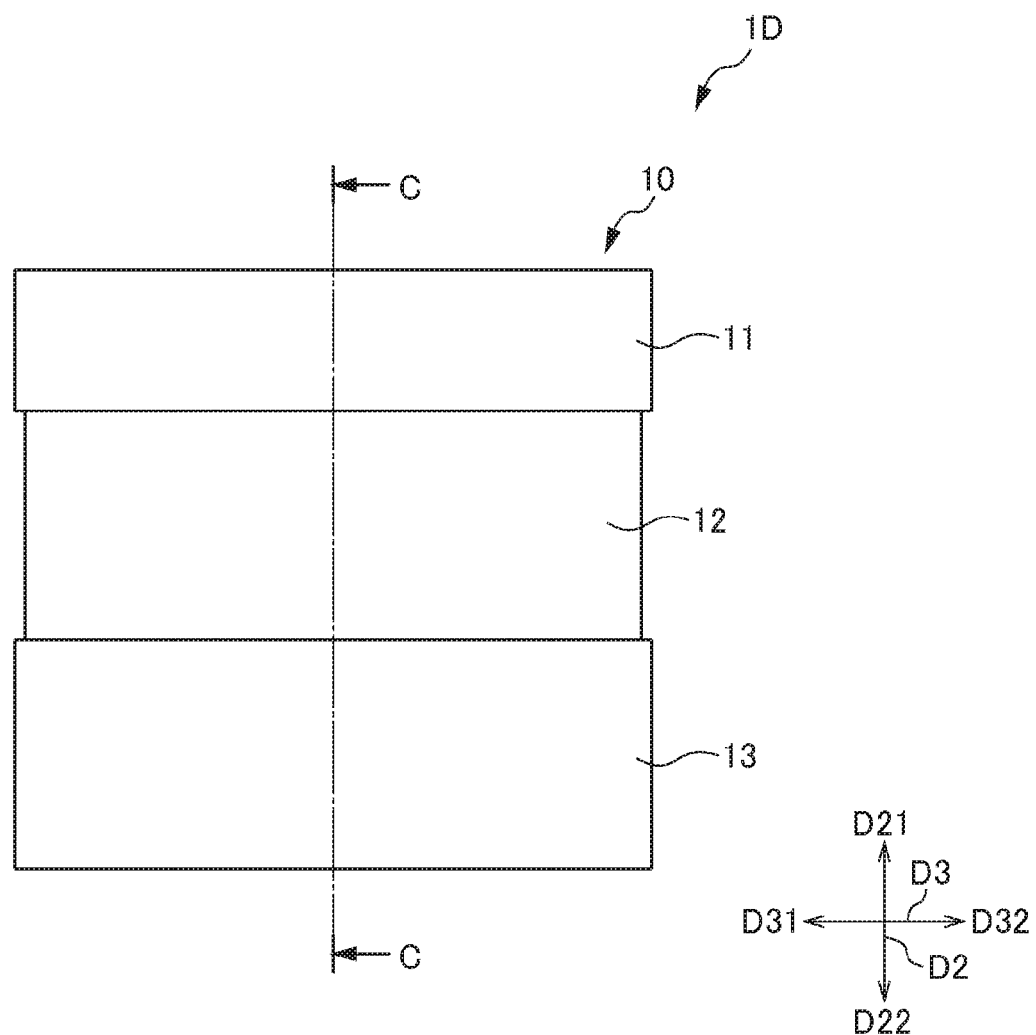
FIG. 11 is a front view illustrating a packing structure 1D for packing a substrate storing container 2 according to the fifth embodiment of the present invention.
Figure 12:
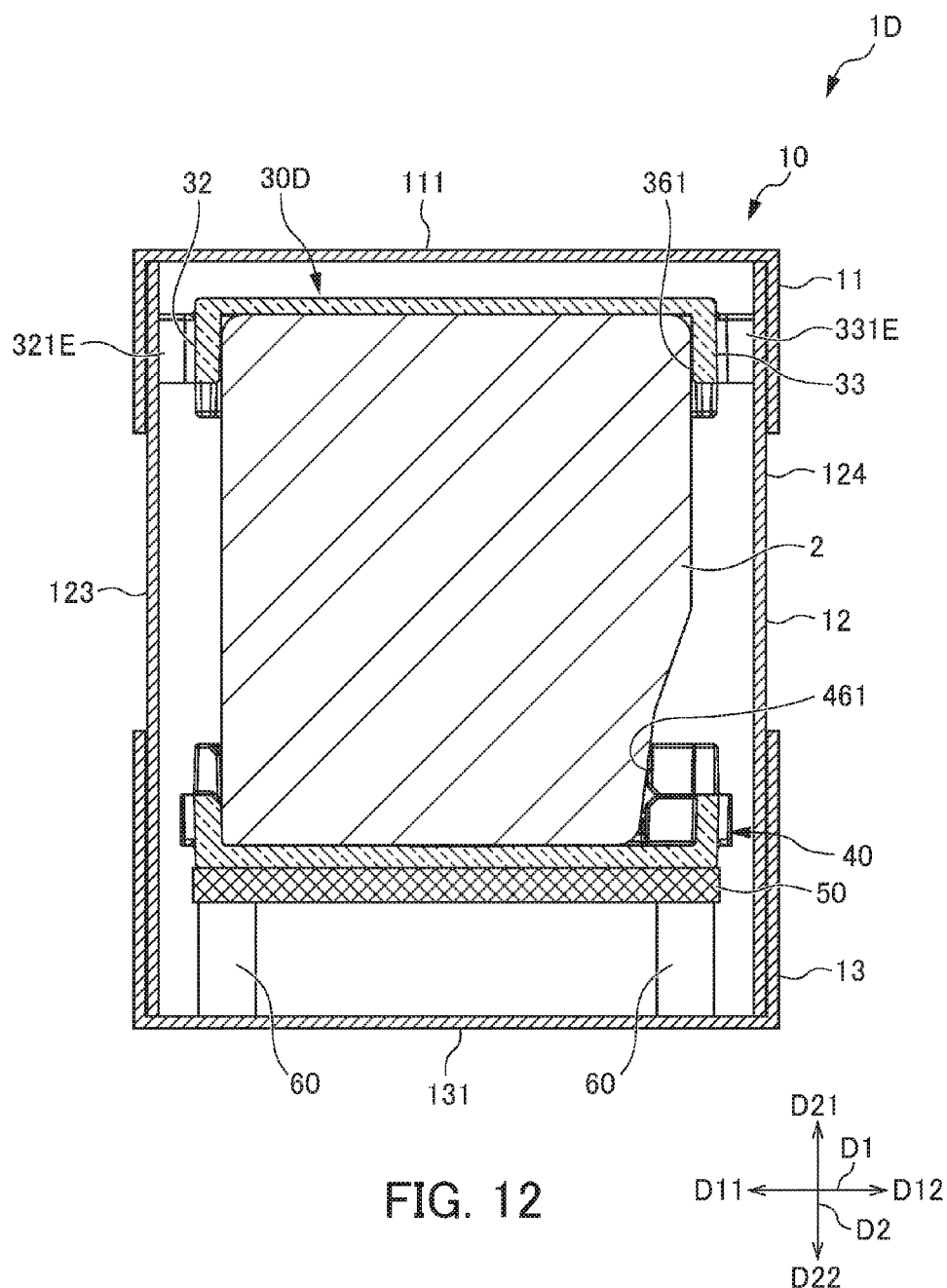
FIG. 12 is a cross-sectional view along a line C-C of FIG. 11.

In the following, a packing structure 1D for packing a substrate storing container 2 according to the fifth embodiment of the present application will be described. FIG. 11 is a front view illustrating a packing structure 1D for packing a substrate storing container 2 according to the fifth embodiment of the present invention. FIG. 12 is a cross-sectional view along the line C-C in FIG. 11.

The fifth embodiment is different from the first embodiment in the point that the shape of the upper cushioning material 30D is different from the shape of the upper cushioning material 30. Regarding configurations other than this, since the fifth embodiment is the same as the first embodiment, the same members are illustrated with the same reference numerals, and the descriptions thereof will be omitted. It should be noted that, in FIG. 12, for the purpose of convenience, the illustration of the inside of the substrate storing container 2 will be omitted.

As illustrated in FIG. 12, the projecting amounts of the convex portion 321E and the convex portion 331E at the forward/backward side faces 32 and 33 of the upper cushioning material 30D are greater than the projecting amounts of the convex portion 321 and the convex portion 331 of the first embodiment that project in the same direction. For this reason, the convex portion 321E and the convex portion 331E are in contact with the front plate 123 and the back plate 124 of the packing box 10.

According to the packing structure 1D for packing the substrate storing container 2 according to the fifth embodiment with the abovementioned configuration, the following effects can be obtained. As described above, since the convex portion 321E and the convex portion 331E are in contact with the front plate 123 and the back plate 124 of the packing box 10, respectively, the upper cushioning material 30D is in contact with the front plate 123 and the back plate 124 of the packing box 10. Due to this, it is possible to support the upper cushioning material 30D in the forward/backward direction D1 by way of the front plate 123 and the back plate 124, and it is possible to suppress the upper cushioning material 30D from being vibrated in the forward/backward direction D1.

Figure 13:
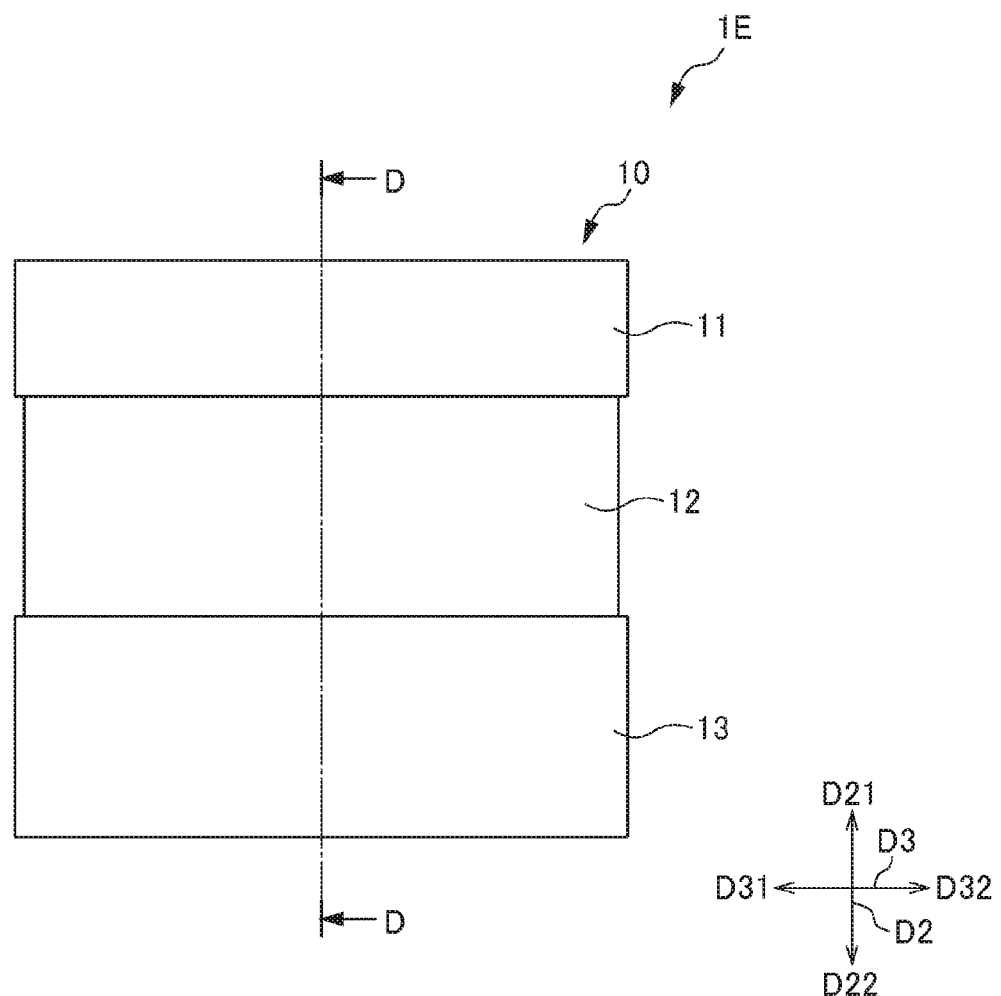
FIG. 13 is a front view illustrating a packing structure 1E for packing a substrate storing container 2 according to the sixth embodiment of the present embodiment.
Figure 14:
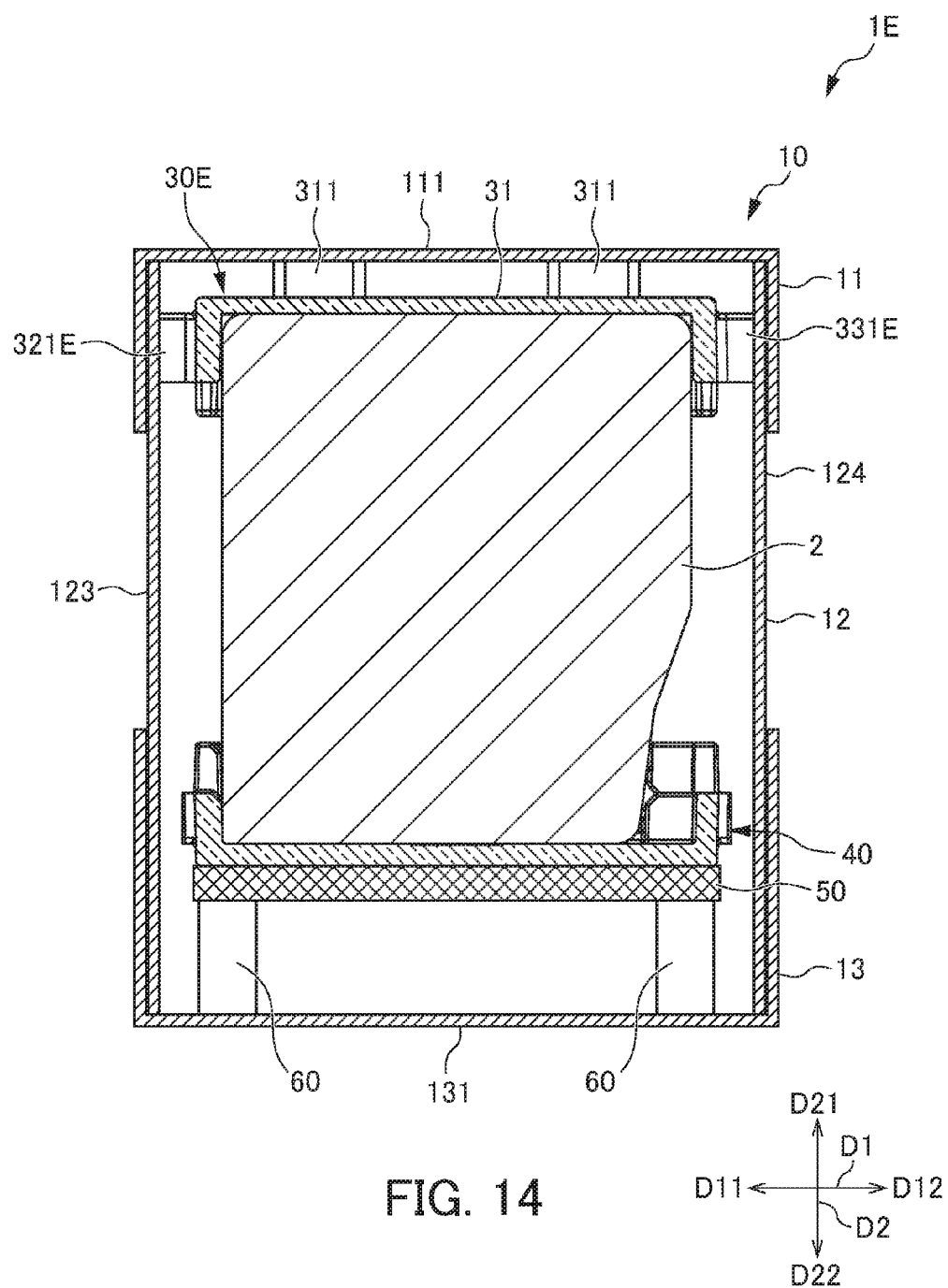
FIG. 14 is a cross-sectional view along the line D-D in FIG. 13.

In the following, a packing structure 1E for packing a substrate storing container 2 according to the sixth embodiment of the present application will be described. FIG. 13 is a front view illustrating a packing structure 1E for packing a substrate storing container 2 according to the sixth embodiment of the present embodiment. FIG. 14 is a cross-sectional view along the line D-D in FIG. 13.

The sixth embodiment is different from the fifth embodiment in the point that the shape of the upper cushioning material 30E is different from the shape of the upper cushioning material 30D. Regarding configurations other than this, since the sixth embodiment is the same as the fifth embodiment, the same members are illustrated with the same reference numerals, and the descriptions thereof will be omitted. It should be noted that, in FIG. 14 for the purpose of convenience, the illustration of the inside of the substrate storing container 2 will be omitted.

Upward projecting convex portions 311 exist on an upper face 31 of the upper cushioning material 30E. The upward projecting convex portions 311 are formed in the proximity of the four corners of the upper face 31 of the upper cushioning material 30E in a substantially rectangular shape and have the same cuboid shape that projects upwards. For this reason, as illustrated in FIG. 14, the upward projecting convex portion 311 is in contact with the top plate 11 of the packing box 10.

According to the packing structure 1E for packing the substrate storing container 2 according to the sixth embodiment with the abovementioned configuration, it is possible to support the upper cushioning material 30E in the forward/backward direction D1 by way of the front plate 123 and back plate 124, and it is possible to suppress the upper cushioning material 30E from being vibrated in the forward/backward direction D1. Furthermore, by means of the top plate 111, it is possible to suppress the upper cushioning material 30E, the substrate storing container 2, the lower cushioning material 40, and the rigid body 50 from moving up and down due to the vibration in the vertical direction.

Figure 15:
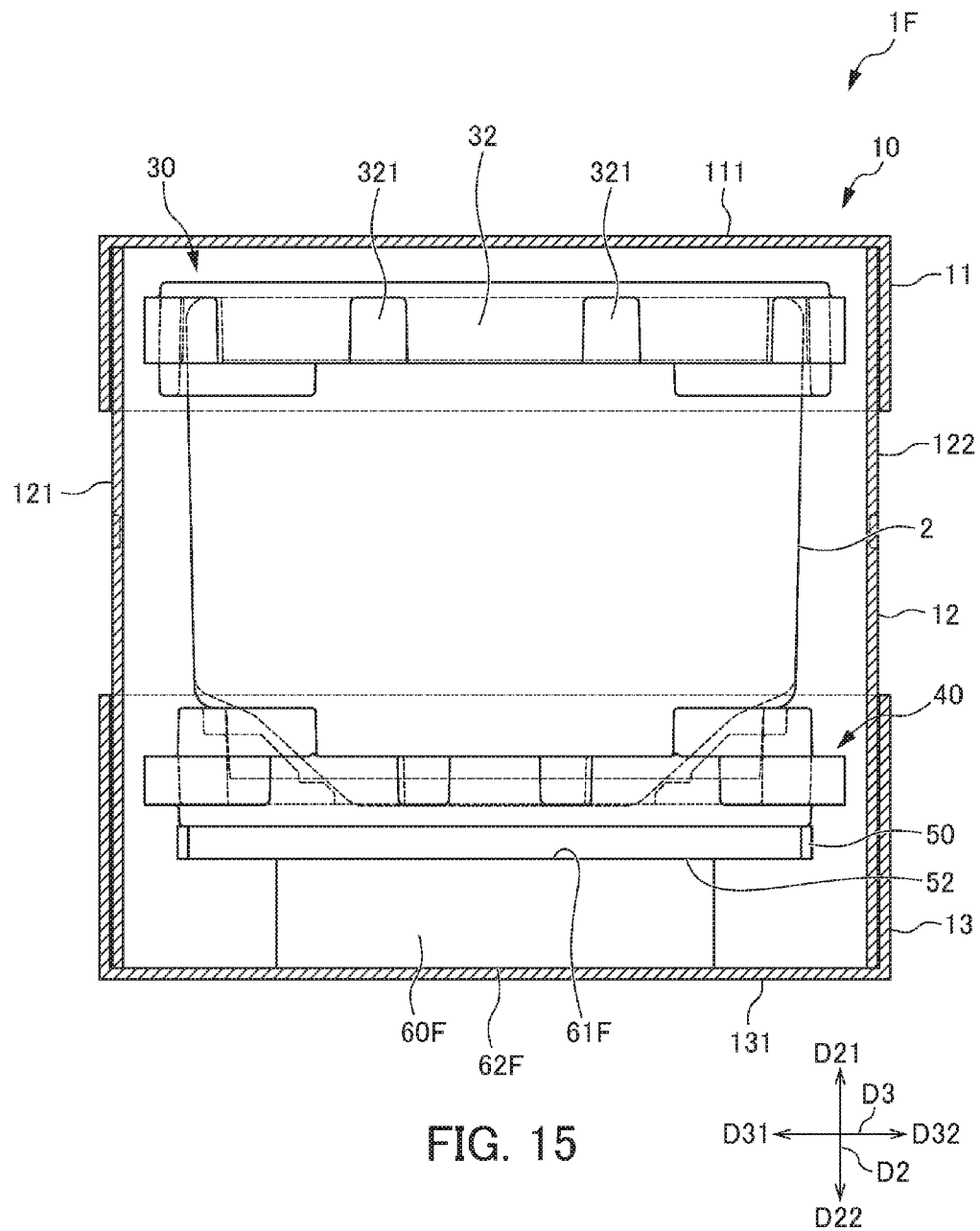
FIG. 15 is a cross-sectional view illustrating a packing structure 1F for packing a substrate storing container 2 according to the seventh embodiment of the present invention.

In the following, a packing structure 1F for packing a substrate storing container 2 according to the seventh embodiment of the present application will be described. FIG. 15 is a cross-sectional view illustrating a packing structure 1F for packing a substrate storing container 2 according to the seventh embodiment of the present invention.

The seventh embodiment is different from the first embodiment in the point of a sponge 60F being used as the elastic support member in place of the coil spring 60. Regarding configurations other than this, since the seventh embodiment is the same as the first embodiment, the same members are illustrated with the same reference numerals, and the descriptions thereof will be omitted.

The sponge 60F has a cuboid shape. The entirety of an upper face 61F of the sponge 60F is fixed at a lower face 52 of a rigid body 50 and the entirety of a lower face 62F of the sponge 60F is fixed at an upper face of the bottom plate 131. As illustrated in FIG. 15, both side faces, a front face, and a back face of the sponge 60F are not in contact with a sleeve member 12 that constitutes a packing box 10, and thus are spaced apart from a first side plate 121, a second side plate 122, a front plate 123, and a back plate 124 of the sleeve member 12.

According to the packing structure 1F for packing the substrate storing container 2 according to the seventh embodiment with the abovementioned configuration, since the sponge 60F is used as an elastic support member, it is possible to elastically support the lower cushioning material 40 via the rigid body 50 by way of an elastic support member having a simple configuration.

Figure 16:
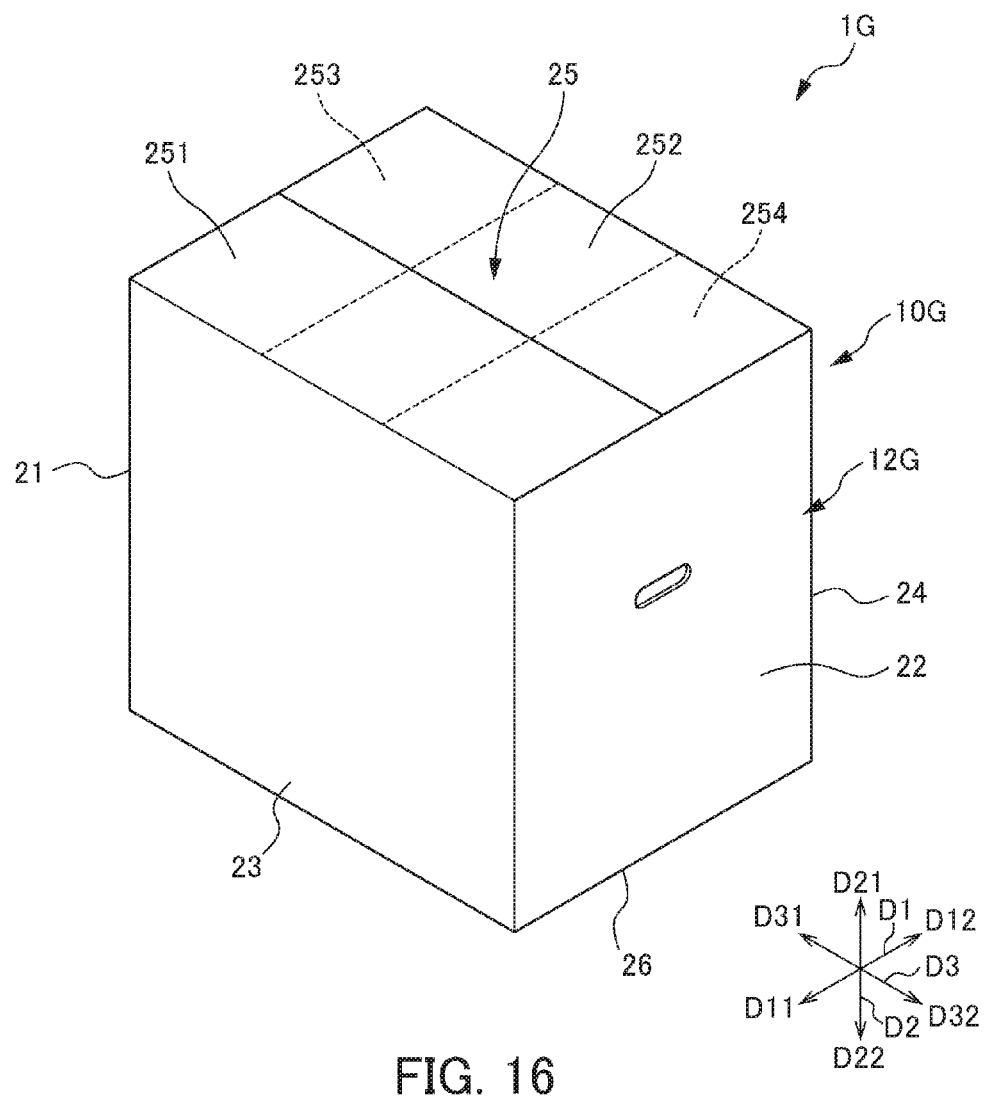
FIG. 16 is a perspective view illustrating a packing structure 1G for packing a substrate storing container 2 according to the eighth embodiment of the present invention.

In the following, a packing structure 1G for packing a substrate storing container 2 according to the eighth embodiment of the present application will be described. FIG. 16 is a perspective view illustrating a packing structure 1G for packing a substrate storing container 2 according to the eighth embodiment of the present invention.

The eighth embodiment is different from the first embodiment in the point that a so-called cardboard-box-type packing box 10G is used in place of the packing box 10 configured by an upper lid 11, a sleeve member 12, and a lower lid 13. Regarding configurations other than this, since the eighth embodiment is the same as the first embodiment, the same members are illustrated with the same reference numerals, and the descriptions thereof will be omitted.

The packing box 10G includes a first side plate 21, a second side plate 22, a front plate 23, a back plate 24, a top plate 25, and a bottom plate 26. The first side plate 21 has a positional relationship in parallel with the second side plate 22. The front plate 23 has a positional relationship in parallel with the back plate 24. The top plate 25 has a positional relationship in parallel with the bottom plate 26. The first side plate 21, the second side plate 22, the front plate 23, and the back plate 24 have rectangular shapes, respectively. With the first side plate 21, the second side plate 22, the front plate 23, and the back plate 24, a cylindrical body 12G in a square pole shape is configured with openings formed at an upper end and a lower end.

The top plate 25 includes a front portion plate 251, a rear back portion plate 252, a left portion plate 253, and a right portion plate 254 that have a rectangular shape, respectively. The front portion plate 251 is integrally connected with an upper side of the front plate 23. The back portion plate 252 is integrally connected with an upper side of the back plate 24. The left portion plate 253 is integrally connected with an upper side of the first side plate 21. The right portion plate 254 is integrally connected with an upper side of the second side plate 22.

With the left portion plate 253 and the right portion plate 254 in a positional relationship perpendicular to the first side plate 21 and the second side plate 22 (horizontal positional relationship), an opening at the upper end of the cylindrical body 12G is partially closed. Then, with the front portion plate 251 and the back portion plate 252 in a positional relationship perpendicular to the front plate 23 and the back plate 24 (horizontal positional relationship) from the above, the entire opening at the upper end of the cylindrical body 12G is closed. Since the bottom plate 26 has a configuration similar to the top plate 25, the description thereof will be omitted.

According to the packing structure 1G for packing the substrate storing container 2 according to the eighth embodiment with the abovementioned configuration, since a so-called cardboard-box-type packing box 10G is used as a packing box, it is possible to pack the substrate storing container 2 with the packing box 10G having a simple configuration.

The present invention is not limited to the abovementioned embodiments, and modifications thereto within the technical scope claimed in the claims are possible. For example, although the elastic support member is configured with the coil spring 60 or the sponge 60F, the present invention is not limited thereto. For example, it may be configured by any of an air spring, gel, rubber, and polymeric foam having elasticity. Herein, polymeric foam body having elasticity indicates that polymeric foams without elasticity such as pumice are not included.

Since the elastic support member is configured by any of an air spring, gel, rubber, and polymeric foam having elasticity, it is possible to select a material that constitutes an elastic support member appropriately according to the elasticity required.

In addition, in the second embodiment, the convex portions 321B, 331B, and 341B are in contact with the first side plate 121 of the packing box 10 at the upper cushioning material 30A, the convex portions 321B, 331B, and 351B are in contact with the second side plate 122 of the packing box 10. Furthermore, in the fifth embodiment, the convex portion 321E is in contact with the front plate 123 of the packing box 10 at the upper cushion material 30D, and the convex portion 331E is in contact with the back plate 124 of the packing box 10. However, the present invention is not limited to these configurations. For example, it may be configured so that, at the upper cushioning material, the convex portions 321B, 331B, and 341B are in contact with the first side plate 121 of the packing box 10, the convex portions 321B, 331B, and 351B are in contact with the second side plate 122 of the packing box 10, the convex portion 321E is in contact with the front plate 123 of the packing box 10, and the convex portion 331E is in contact with the back plate 124 of the packing box 10.

With such a configuration, it is possible to suppress the upper cushioning material from being swung in the forward/backward direction and the left/right direction.

Furthermore, although the upper face 51 of the rigid body 50 abuts the lower face 41 serving as the lower end face of the lower cushioning material 40 to support the lower cushioning material 40 in the first embodiment, the present invention is not limited to this configuration. For example, it may be configured so that a cushioning material such as a sponge is disposed between the upper face 51 of the rigid body 50 and the lower face 41 of the lower cushioning material 40, and the upper face 51 of the rigid body 50 supports the lower face 41 of the lower cushioning material 40 via the cushioning material.

Furthermore, the materials of the upper cushioning material, the lower cushioning material, and the rigid body are not limited to the materials described in the embodiments. For example, it may be configured so that the rigid body is composed of a plywood board or an aluminum plate (sheet metal).

Furthermore, although the packing box 10, 100 is composed of a so-called plastic card board box (corrugated plastic, also known as "pladan"), present invention is not limited thereto. For example, it may be configured so that the packing box is composed of a corrugated cardboard made of paper or aluminum frame.

Furthermore, the substrate storing container is not limited to the shapes and the dimensions of the embodiments.

EXPLANATION OF REFERENCE NUMERALS 1, 1A, 1B, 1C, 1D, 1E, 1F, 1G packing structure
2 substrate storing container
10, 10G packing box
11 upper lid
12 sleeve member
13 lower lid
30, 30A, 30B, 30C, 30D, 30E upper cushioning material
40 lower cushioning material
50 rigid body
51 upper face
52 lower face
60 coil spring
60F sponge
101 upper space
102 upper space
103 intermediate space
104 lower space
105 space
106 lower space
111 top plate
121 first side plate
122 second side plate
123 front plate
124 back plate
131 bottom plate
W substrate

The invention claimed is:

1. A packing structure for packing a substrate storing container for storing and transporting substrates composed of semiconductor wafers, comprising:
a packing box in a cuboid shape having a first side plate, a second side plate, a front plate, a back plate, a top plate, and a bottom plate;
an upper cushioning material that can be placed on the substrate storing container in the packing box;
a lower cushioning material on which the substrate storing container can be placed, and which is disposed in the packing box in such a manner that the substrate storing container can be sandwiched by the upper cushioning material and the lower cushioning material in a vertical direction; and
an elastic support member which is disposed in the packing box elastically deforms, so that a lowermost face of the lower cushioning material moves in a vertical direction, the elastic support member supports the lower cushioning material, and a lower end of the elastic support member is fixed in a state abutting a bottom plate and supported by the bottom plate;
wherein the lower cushioning material is not in contact with any of the first side plate, the second side plate, the front plate, and the back plate of the packing box, and a lower space is formed between the lower cushioning material and the first side plate, the second side plate, the front plate and the back plate of the packing box so as to prevent, when vibration is added to the packing box, the vibration from transferring as vibration from the packing box to a side face of the lower cushioning material, in a direction from the back plate to the front plate, and in a forward/backward direction opposite to the direction or vibration in a direction from the second side plate to the first side plate and in a left/right direction opposite to the direction, the lower space allowing air to promptly flow between a space below the lower space and an inteitnediate space above the lower space;
wherein the space below the lower space is a space positioned below the lowermost end of the lower cushioning material and the intermediate space above the lower space is a space above the lower cushioning material; and
wherein the elastic support member is configured by a coil spring or gel.

2. The packing structure according to claim 1, wherein the upper cushioning material is in contact with the top plate of the packing box.

3. The packing structure according to claim 1, wherein the upper cushioning material is in contact with the first side plate, the second side plate, the front plate, and the back plate of the packing box.

4. The packing structure according to claim 1, wherein the upper cushioning material is not in contact with any of the first side plate, the second side plate, the front plate, and the back plate of the packing box, and an upper space is formed between the upper cushioning material and the first side plate, the second side plate, the front plate and the back plate of the packing box.

5. The packing structure according to claim 1, wherein the packing box is configured from a lower lid having the bottom plate, a sleeve member which is configured from the first side plate, the second side plate, the front plate, and the back plate and which has a square cylinder shape having an axial center extending in a vertical direction, and an upper lid having the top plate, wherein a lower end portion of the sleeve member is placed on the bottom plate of the lower lid, and the top plate of the upper lid is placed on an upper end portion of the sleeve member.

6. The packing structure according to claim 1, further comprising:
a rigid body which is disposed in the packing box and has a plate shape having a planar upper face and a planar lower face, wherein the upper face of the rigid body supports the lower cushioning material, and the lower face of the rigid body abuts an upper end portion of the elastic support member and is supported by the elastic support material,
wherein the rigid body has rigidity which can suppress deformation of the lower cushioning material and support the lower cushioning material when the substrate storing container is placed at the lower cushioning material, and is not in contact with the first side plate, the second side plate, the front plate, and the back plate of the packing box, wherein a space is formed between the rigid body and the first side plate, the second side plate, the front plate, and the back plate of the packing box, and
wherein the upper end portion of the elastic support member indirectly supports the lower cushioning material via the rigid body.

7. A packing structure for packing a substrate storing container for storing and transporting substrates composed of semiconductor wafers, comprising:
a packing box in a cuboid shape having a first side plate, a second side plate, a front plate, a back plate, a top plate, and a bottom plate;

an upper cushioning material that can be placed on the substrate storing container in the packing box;
a lower cushioning material on which the substrate storing container can be placed, and which is disposed in the packing box in such a manner that the substrate storing container can be sandwiched by the upper cushioning material and the lower cushioning material in a vertical direction; and
an elastic support member which is disposed in the packing box elastically deforms, so that a lowermost face of the lower cushioning material moves in a vertical direction, the elastic support member is supported by a bottom plate of the packing box, and supports the lower cushioning material,
wherein the lower cushioning material is not in contact with any of the first side plate, the second side plate, the front plate, and the back plate of the packing box, and a lower space is formed between the lower cushioning material and the first side plate, the second side plate, the front plate and the back plate of the packing box so as to prevent, when vibration is added to the packing box, the vibration from transferring as vibration from the packing box to a side face of the lower cushioning material, in a direction from the back plate to the front plate, and in a forward/backward direction opposite to the direction or vibration in a direction from the second side plate to the first side plate and in a left/right direction opposite to the direction, the lower space allowing air to promptly flow between a space below the lower space and an intermediate space above the lower space;
wherein the space below the lower space is a space positioned below the lowermost end of the lower cushioning material and the intermediate space above the lower space is a space above the lower cushioning material; and
wherein the elastic support member is configured by a coil spring or gel;
wherein the upper cushioning material is not in contact with the packing box, and an upper space is formed between the upper cushioning material and the top plate of the packing box.

* * * * *